(12) United States Patent
Rigano

(10) Patent No.: US 11,557,593 B2
(45) Date of Patent: Jan. 17, 2023

(54) ARRAY OF MEMORY CELLS, METHODS USED IN FORMING AN ARRAY OF MEMORY CELLS, METHODS USED IN FORMING AN ARRAY OF VERTICAL TRANSISTORS, AND METHODS USED IN FORMING AN ARRAY OF CAPACITORS

(71) Applicant: Micron Technology, Inc., Boise, ID (US)

(72) Inventor: Antonino Rigano, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/106,832

(22) Filed: Nov. 30, 2020

(65) Prior Publication Data

US 2022/0173109 A1  Jun. 2, 2022

(51) Int. Cl.
*H01L 21/00*     (2006.01)
*H01L 27/108*    (2006.01)
(Continued)

(52) U.S. Cl.
CPC ...... *H01L 27/10823* (2013.01); *G11C 11/221* (2013.01); *H01L 27/10864* (2013.01);
(Continued)

(58) Field of Classification Search
CPC ......... H01L 27/10823; H01L 27/10864; H01L 27/11507; H01L 27/11509; H01L 29/7827; G11C 11/221
See application file for complete search history.

(56) References Cited

U.S. PATENT DOCUMENTS 6,278,149 B1   8/2001  Sato et al.
6,638,812 B2  10/2003  Schlosser et al.
(Continued)

FOREIGN PATENT DOCUMENTS

JP      2013-168570      8/2013
KR   10-2018-011652     10/2018
(Continued)

OTHER PUBLICATIONS

Chen et al., "Chemistry for Positive Pattern Transfer Using Area-Selective Atomic Layer Deposition", Advanced Materials, 2016, United States, pp. 1086-1090.
(Continued)

*Primary Examiner* — Richard A Booth
(74) *Attorney, Agent, or Firm* — Wells St. John P.S.

(57) ABSTRACT

A method used in forming an array of memory cells comprises forming a vertical stack comprising transistor material directly above and directly against a first capacitor electrode material. A mask is used to subtractively etch both the transistor material and thereafter the first capacitor electrode material to form a plurality of pillars that individually comprise the transistor material and the first capacitor electrode material. Capacitors are formed that individually comprise the first capacitor electrode material of individual of the pillars. Vertical transistors are formed above the capacitors that individually comprise the transistor material of the individual pillars. Other aspects and embodiments are disclosed, including structure independent of method.

26 Claims, 27 Drawing Sheets

(51) Int. Cl.
| | |
|---|---|
| *H01L 27/11509* | (2017.01) |
| *G11C 11/22* | (2006.01) |
| *H01L 29/78* | (2006.01) |
| *H01L 27/11507* | (2017.01) |

(52) U.S. Cl.
CPC .. *H01L 27/11507* (2013.01); *H01L 27/11509* (2013.01); *H01L 29/7827* (2013.01)

(56) References Cited

U.S. PATENT DOCUMENTS

| | | | |
|---|---|---|---|
| 9,305,929 | B1 | 4/2016 | Karda et al. |
| 9,837,420 | B1 | 12/2017 | Ramaswamy |
| 10,163,917 | B2 | 12/2018 | Ramaswamy |
| 2002/0017671 | A1 | 2/2002 | Goebel et al. |
| 2003/0082875 | A1 | 5/2003 | Lee |
| 2007/0051997 | A1 | 3/2007 | Haller et al. |
| 2008/0099816 | A1 | 5/2008 | Brown |
| 2010/0052029 | A1 | 3/2010 | Huang |
| 2012/0037970 | A1 | 2/2012 | Park et al. |
| 2012/0193697 | A1 | 8/2012 | Takemura |
| 2013/0001666 | A1 | 1/2013 | Heineck et al. |
| 2013/0330891 | A1 | 12/2013 | Chang et al. |
| 2017/0358609 | A1 | 12/2017 | Yamazaki et al. |
| 2018/0197862 | A1 | 7/2018 | Sills et al. |
| 2019/0027478 | A1 | 1/2019 | Sandhu et al. |
| 2019/0139960 | A1 | 5/2019 | Sills et al. |
| 2019/0148066 | A1 | 5/2019 | Wang et al. |
| 2019/0189357 | A1 | 6/2019 | Chavan et al. |
| 2019/0296028 | A1 | 9/2019 | Sukekawa |
| 2020/0020695 | A1 | 1/2020 | Leobandug |
| 2020/0203357 | A1 | 6/2020 | Chhajed et al. |
| 2020/0235111 | A1 | 7/2020 | Calderoni et al. |
| 2020/0295008 | A1 | 9/2020 | Tang et al. |
| 2022/0173135 | A1* | 6/2022 | Mariani ................. H01L 21/84 |
| 2022/0190004 | A1* | 6/2022 | Mariani ................. H01L 27/13 |

FOREIGN PATENT DOCUMENTS

| | | |
|---|---|---|
| WO | WO 2018/132249 | 7/2018 |
| WO | WO 2019/099066 | 5/2019 |

OTHER PUBLICATIONS

Kim, et al., "Atomic Layer Deposition of Ni Thin Films and Application to Area-Selective Deposition", Journal of The Electromechanical Society 158, 2011, United States, pp. D1-D5.

Lee et al., "Area-Selective Atomic Layer Deposition of Lead Sulfide: Nanoscale Patterning and DFT Simulations", Langmuir, 2010, United States, pp. 6845-6852.

Lee et al., "High Quality Area-Selective Atomic Layer Deposition Co Using Ammonia Gas as a Reactant", Journal of The Electromechanical Society 157, 2010, United States, pp. D10-D15.

Mackus et al., "The use of atomic layer deposition in advanced nanopatterning", Nanoscale, 2014, United Kingdom, pp. 10941-10960.

Mameli et al., "Area-Selective Atomic Layer Deposition of SiO2 Using Acetylacetone as a Chemoselective Inhibitor in an ABC-Type Cycle", ACS Nano, 2017, United States, pp. 9303-9311.

Park et al., "Microcontact patterning of ruthenium gate electrodes by selective area atomic layer deposition", Applied Physics Letters 86, 2005, United States, pp. 051903-1-051903-3.

U.S. Appl. No. 17/107,242, filed Nov. 30, 2020, by Mariani et al.
U.S. Appl. No. 16/507,826, filed Jul. 10, 2019, by Mutch et al.
U.S. Appl. No. 16/550,917, filed Aug. 26, 2019, by Tang et al.
WO PCT/US2021/058427 Search Rep., dated Mar. 3, 2022, Micron Technology, Inc.
WO PCT/US2021/058427 Writt. Opin., dated Mar. 3, 2022, Micron Technology, Inc.

* cited by examiner

ARRAY OF MEMORY CELLS, METHODS USED IN FORMING AN ARRAY OF MEMORY CELLS, METHODS USED IN FORMING AN ARRAY OF VERTICAL TRANSISTORS, AND METHODS USED IN FORMING AN ARRAY OF CAPACITORS

TECHNICAL FIELD

Embodiments disclosed herein pertain to arrays of memory cells, to methods used in forming an array of memory cells, to methods used in forming an array of vertical transistors, to method used in forming an array of vertical transistors, and to methods used in forming an array of capacitors.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be or non-volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. The gate insulator may be capable of being programmed between at least two retentive capacitive states whereby the transistor is non-volatile. Alternately, the gate insulator may not be so capable whereby the transistor is volatile. Regardless, field effect transistors may also include additional structure, for example a reversibly programmable charge-storage region as part of the gate construction between the gate insulator and the conductive gate.

A capacitor is another type of electronic component that may be used in a memory cell. A capacitor has two electrical conductors separated by electrically insulating material. Energy as a charge may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write store) and read a memory state without reversing the polarization state until such is desired to be reversed. Less desirable, in some memory having ferroelectric capacitors the act of reading the memory state can reverse the polarization. Accordingly, in such instances, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

Capacitors and transistors may of course be used in integrated circuitry other than memory circuitry and fabricated into arrays that may or may not be at least part of a memory array.

DETAILED DESCRIPTION OF EXAMPLE EMBODIMENTS

Embodiments of the invention include methods used in forming an array of capacitors, for example as may be used in memory or other integrated circuitry. Embodiments of the invention also encompass methods used in forming an array of memory cells, for example comprising a plurality of vertical transistors that are above a plurality of capacitors. Embodiments of the invention also encompass an array of memory cells independent of method of manufacture. Example embodiments of methods of forming an array of memory cells are first described with reference to FIGS. 1-23.

Figure 1:
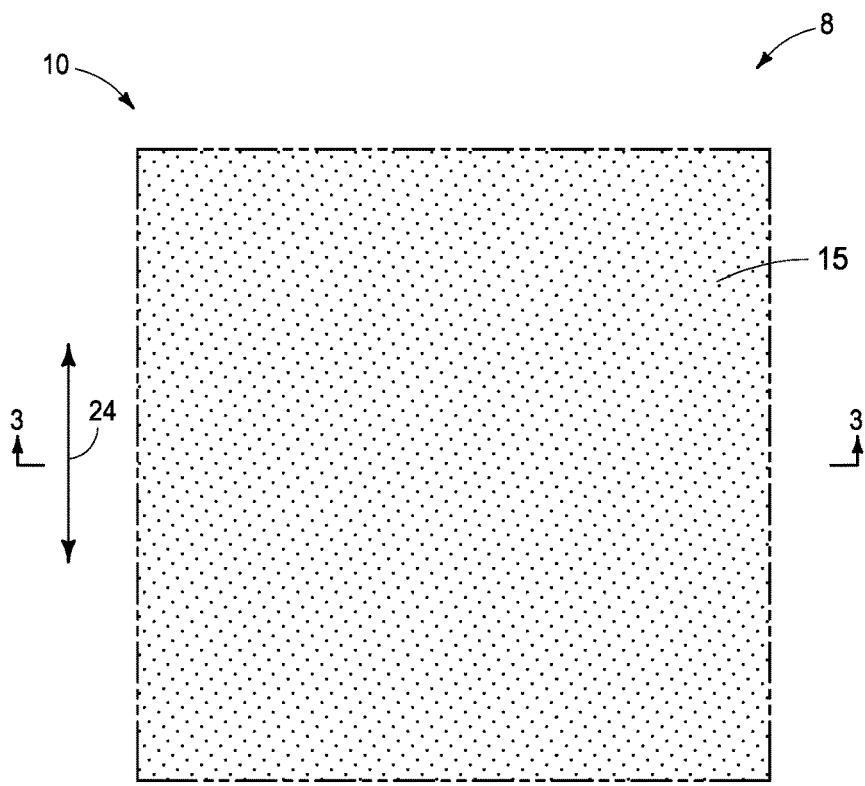
FIG. 1 is a diagrammatic cross-sectional view of a portion of a substrate in process in accordance with an embodiment of the invention and is taken through line 1-1 in FIG. 3.
Figure 2:
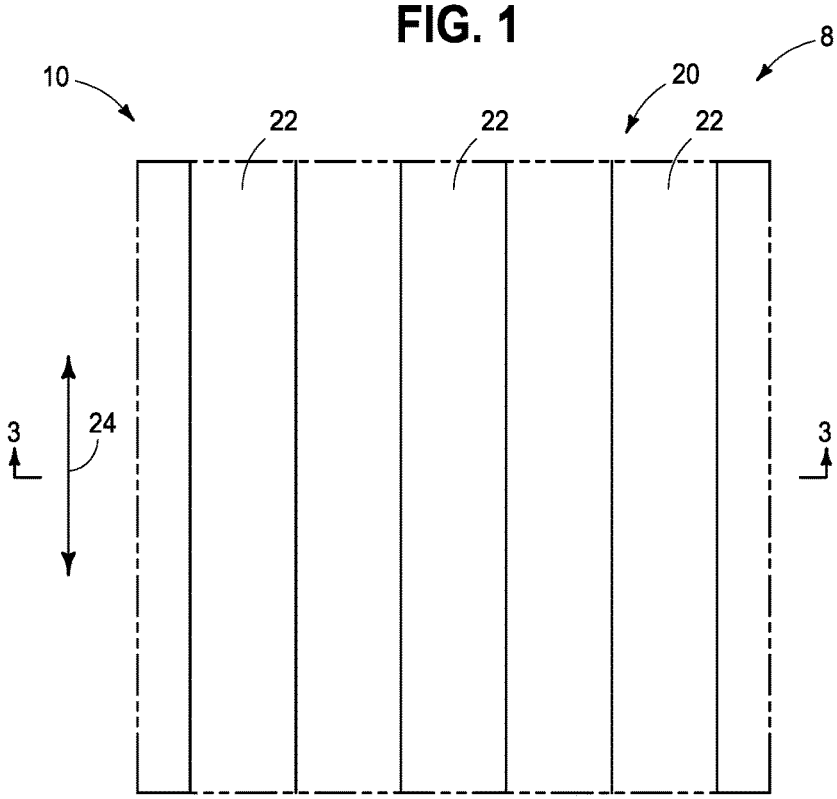
FIG. 2 is a diagrammatic cross-sectional view taken through line 2-2 in FIG. 3.
Figure 3:
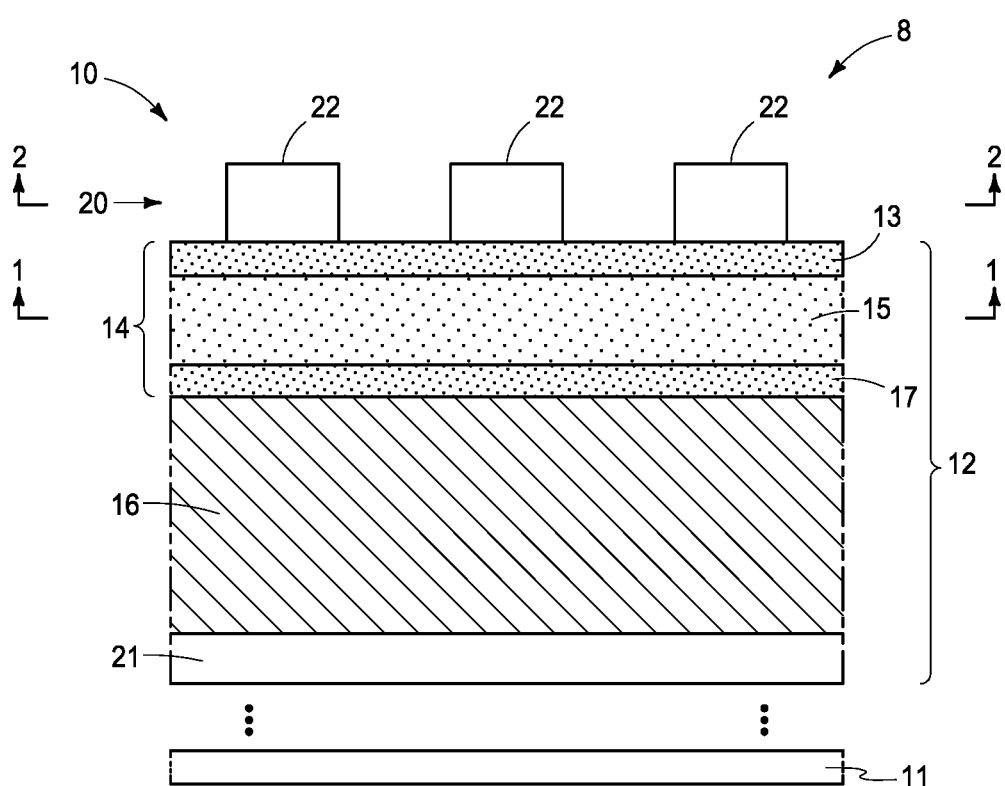
FIG. 3 is a diagrammatic cross-sectional view taken through line 3-3 in FIGS. 1 and 2.

Referring to FIGS. 1-3, such show an example substrate construction 8 comprising an array or array area 10 that has been fabricated relative to a base substrate 11. Substrate 11 may comprise any of conductive/conductor/conducting, semi conductive/semiconductor/semiconducting, and insulative/insulator/insulating (i.e., electrically herein) materials. Various materials are above base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

An example vertical stack 12 is above base substrate 11. Such comprises transistor material 14 directly above and directly against a first capacitor electrode material 16. Example vertical stack 12 is also shown as comprising insulator material 21 (e.g., silicon dioxide and/or silicon nitride). Transistor material 14 in one embodiment comprises top source/drain region material 13 directly above channel region material 15, and in one such embodiment comprises bottom source/drain region material 17 directly under channel region material 15. Alternately, channel region material 15 may be directly against first capacitor electrode material 16, with an uppermost portion of material 16 functioning as a bottom/source drain region. Regardless, first capacitor electrode material 16 comprises one or more conductive materials (intrinsic electrical resistance of 0.0001 to 1.0 ohm·cm), for example elemental tungsten atop conductively-doped polysilicon or atop additional metal material other than elemental tungsten. By way of examples only, materials 13, 15, and 17 may comprise one or more of appropriately-doped crystalline semiconductor material, such as one or more of silicon, germanium, and so-called III/V semiconductor materials (e.g., GaAs, InP, GaP, and GaN), with source/drain region materials 13 and 17 being sufficiently doped to be conductive and channel region material 15 being undoped or sufficiently doped to be semiconductive to conduct in an "on" state and to not conduct in an "off" state of the vertical transistors being formed.

A mask 20 has been formed above vertical stack 12. Such is shown as comprising mask lines 22 extending along a column direction 24, for example, along which digitlines (not-yet-shown) will be formed. Mask 20 may be considered as a first mask 20 in comparison to an example second mask (not-yet-shown) described below and may be sacrificial (e.g., comprising photoresist and/or hard-masking material). Masks formed herein may be formed using pitch multiplication.

Figure 4:
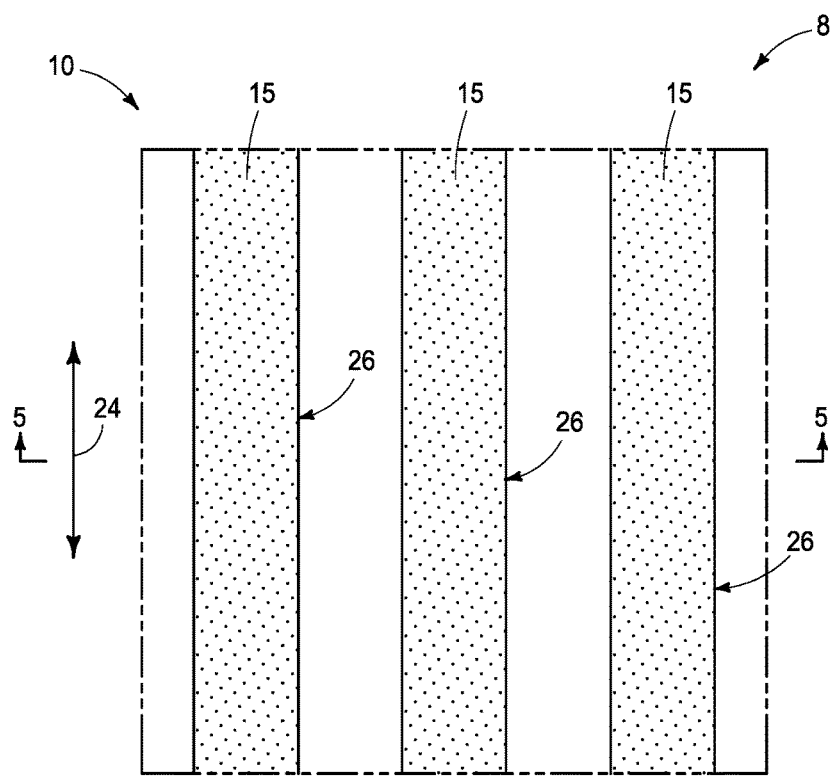
FIGS. 4-50 are diagrammatic sequential sectional, expanded, enlarged, perspective, and/or partial views of the construction of FIGS. 1 and 2, or portions thereof, or partial hybrid schematics or partial schematics thereof, and/or alternate embodiments in process in accordance with some embodiments of the invention.
Figure 5:
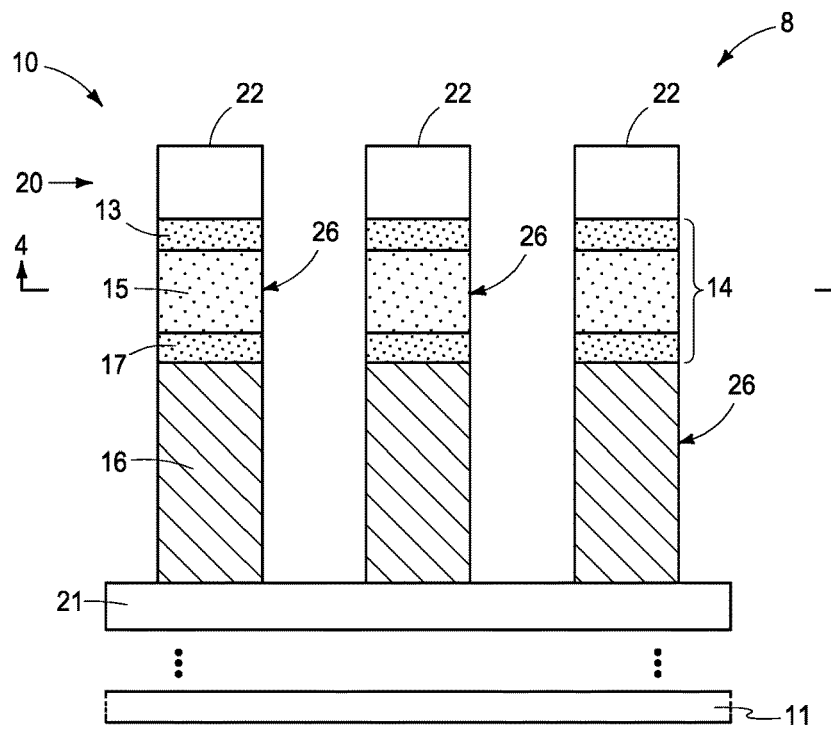

Referring to FIGS. 4 and 5, and in one embodiment, first mask 20 has been used to subtractively etch (e.g., anisotropically) both transistor material 14 and thereafter first capacitor electrode material 16 to form a plurality of walls 26 horizontally-elongated in column direction 24 and that individually comprise transistor material 14 and first capacitor electrode material 16 (e.g., in an etching step using first mask 20 in a single common masking step for the etching of materials 14 and 16 as shown). The processing shown by FIGS. 4 and 5 may cause walls 26 to be tapered in FIG. 5 (not shown) whereby the sides of walls 26 are not vertical, for example being wider at their bottoms than at their tops (not shown).

Figure 6:
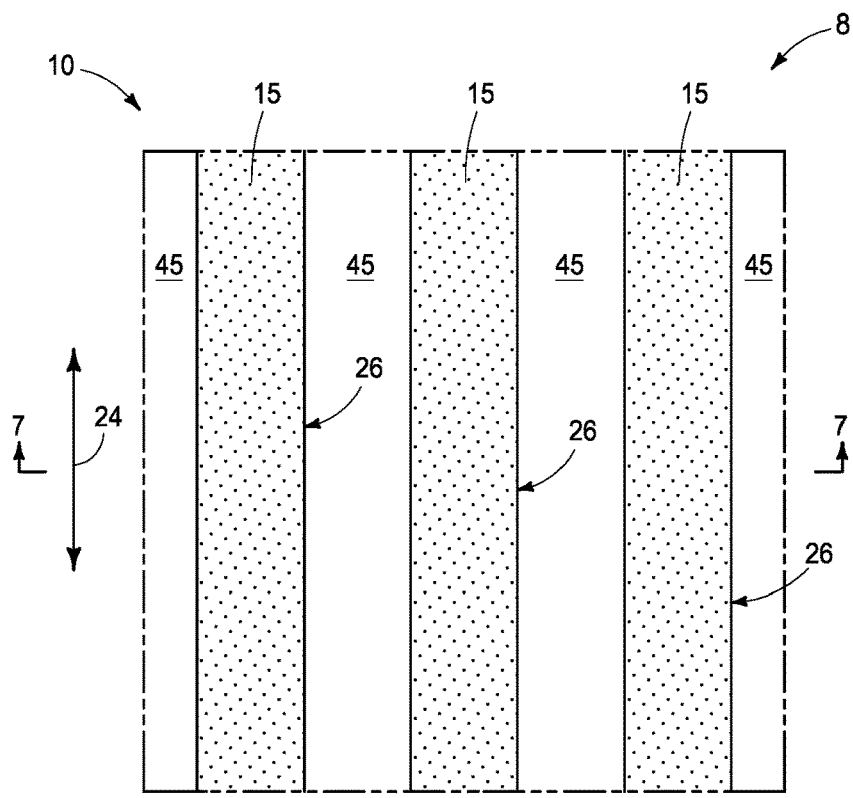
Figure 7:
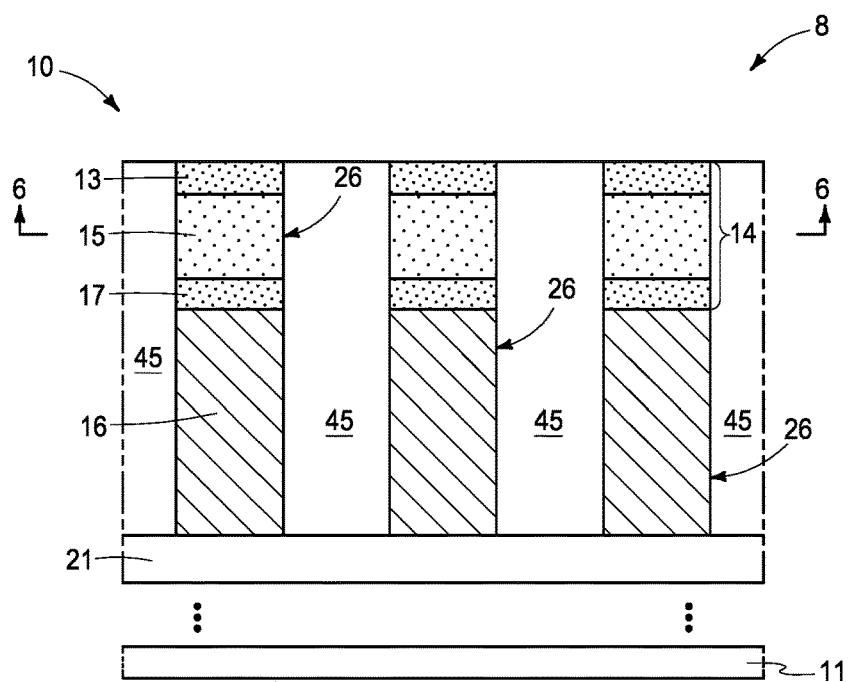

FIGS. 6 and 7 show subsequent removal of first mask 20 (not shown) and filling of space between walls 26 with insulating material 45 (e.g., silicon dioxide and/or silicon nitride).

Figure 8:
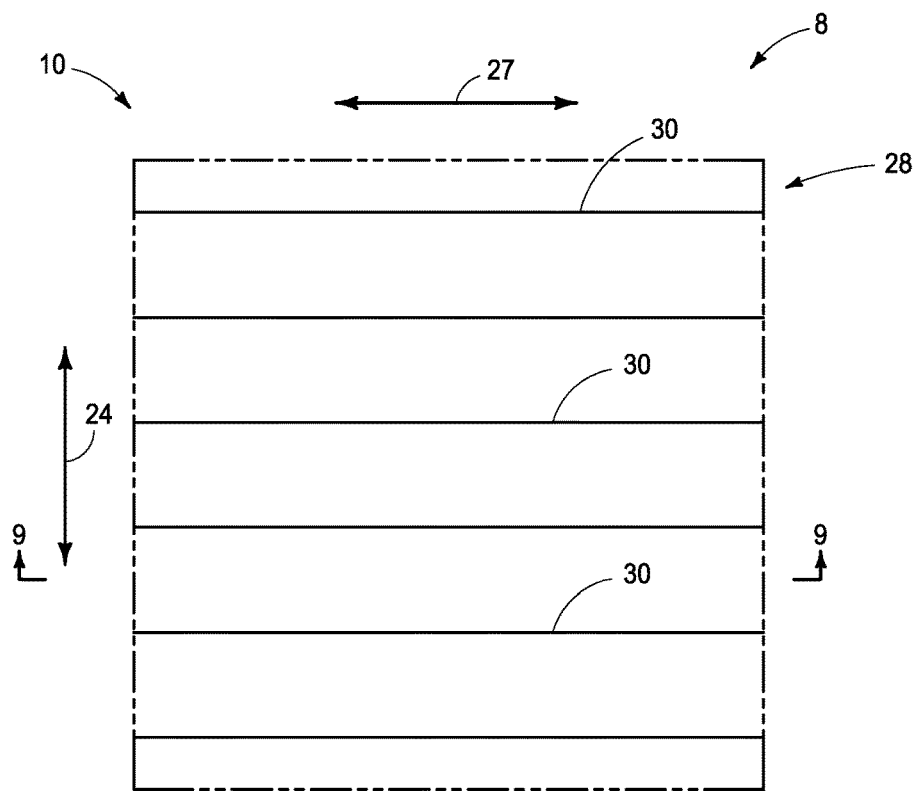
Figure 9:
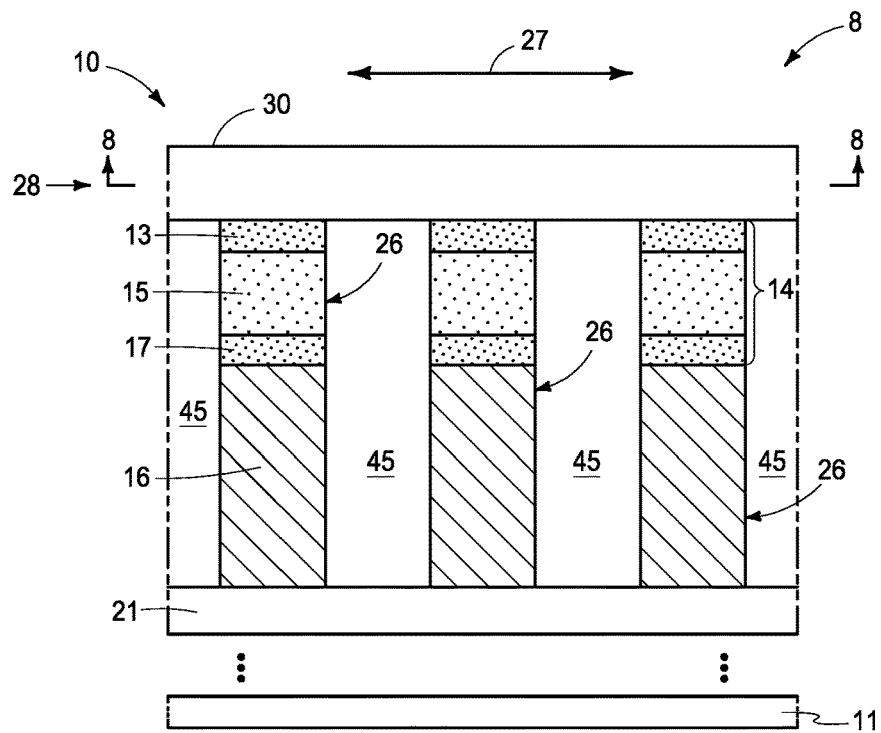
Figure 10:
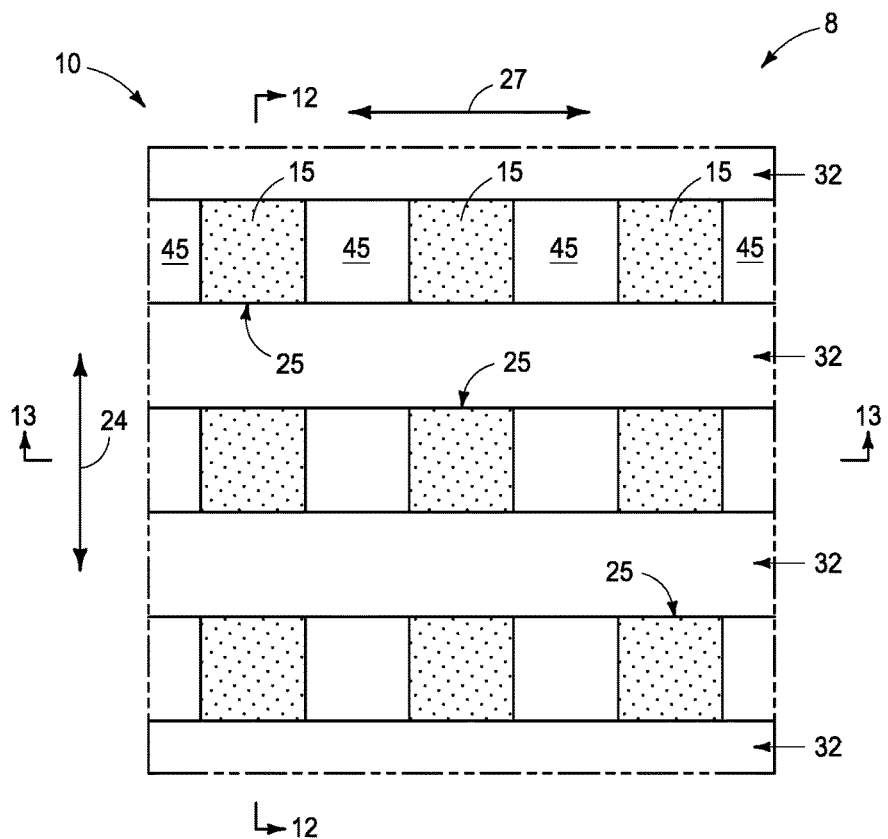
Figure 11:
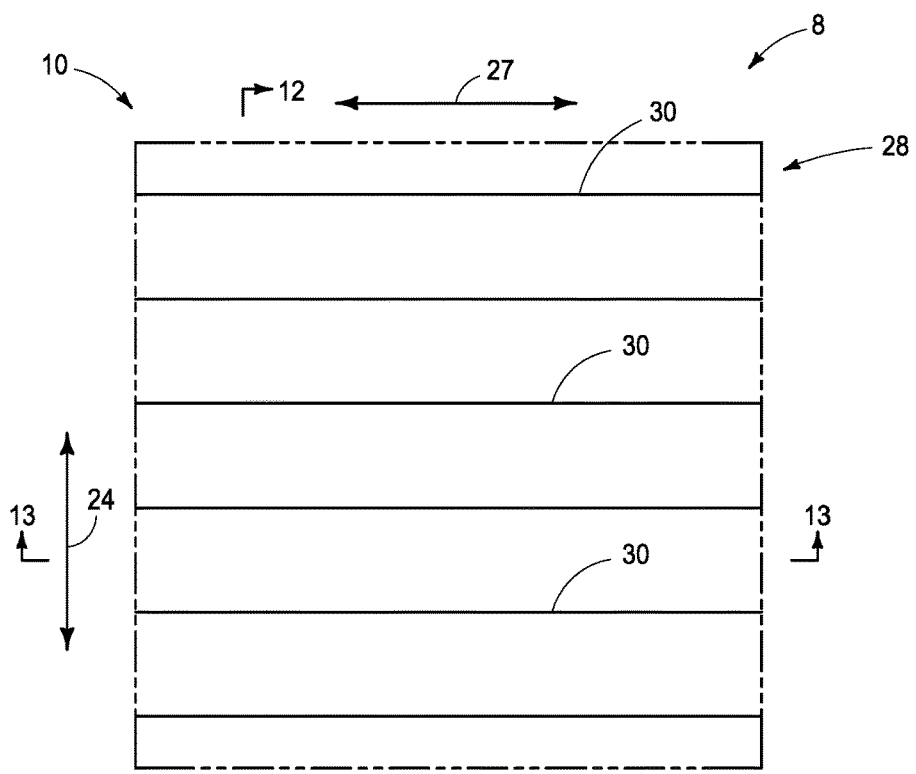
Figure 12:
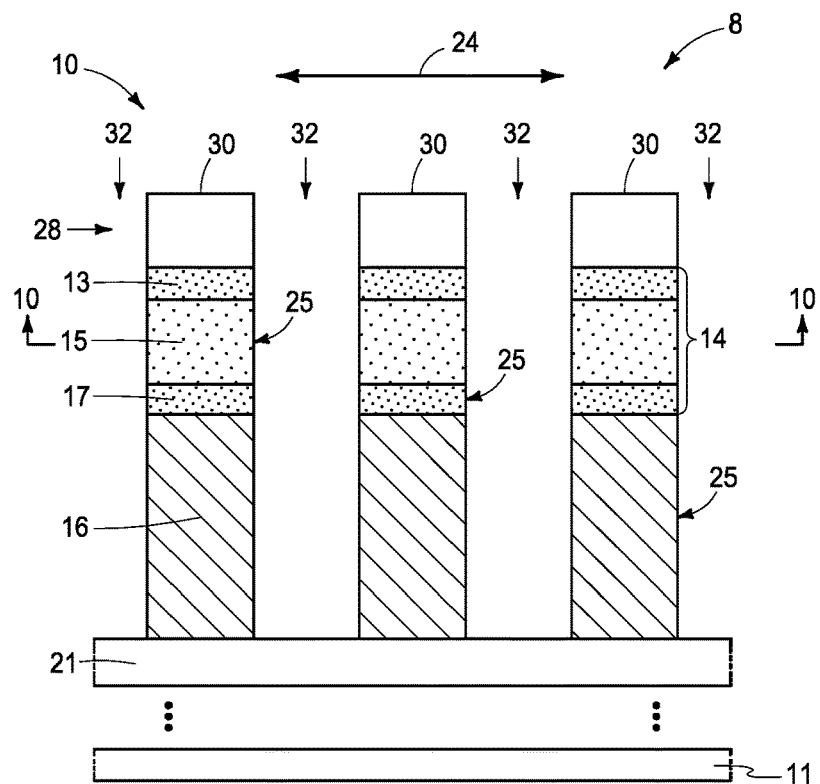
Figure 13:
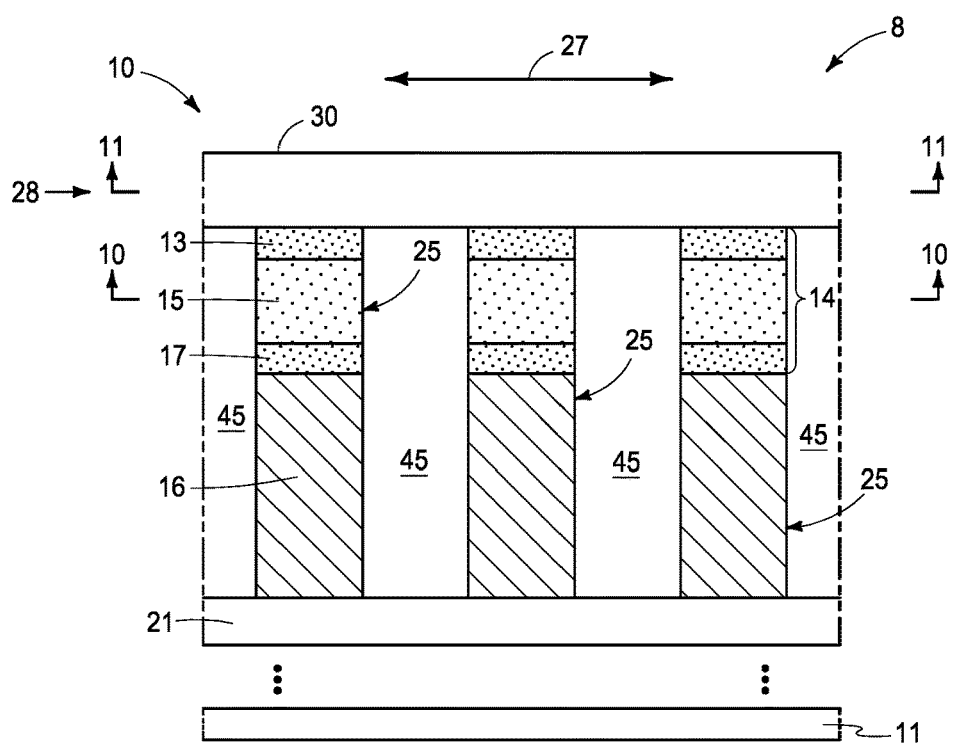

Referring to FIGS. 8 and 9, a mask 28 (e.g., a second mask 28) has been formed after the forming of first mask 20 (not shown) and comprises mask lines 30 that extend along a row direction 27 in which, in one embodiment, gate lines (not-yet-shown) of vertical transistors will be formed. In one embodiment, walls 26 are formed before forming such gate lines (not-yet-shown).

FIGS. 10-13 show using second mask 28 to subtractively etch (e.g., anisotropically) both transistor material 14 and thereafter first capacitor electrode material 16 of walls 26 to form a plurality of pillars 25 individually comprising transistor material 14 and first capacitor electrode material 16. In one embodiment and as shown, such has also formed a plurality of trenches 32 that are individually longitudinally-elongated in and extend along row direction 27 aside first capacitor electrode material 16 of pillars 25. The processing shown by FIGS. 10-13 may cause pillars 25 to be tapered in FIG. 12 (not shown; and/or in FIG. 13 as referred to above with respect to FIG. 5 [not shown]) whereby the sides of pillars 25 are not vertical, for example being wider at their bottoms than at their tops (not shown). Width of pillars 25 and spacing there-between is shown as being the same in directions 24 and 27 although such need not be so, for example with spacing between pillars 25 in one or both of directions 24 and 27 being less at the tops and/or bottoms of pillar 25 (not shown).

The above processing is but one example of using a mask (e.g., 28) to subtractively etch both transistor material 14 and thereafter first capacitor electrode material 16 to form a plurality of pillars 25 that individually comprise transistor material 14 and first capacitor electrode material 16 (e.g., in an etching step using mask 28 in a single common masking step for the etching of materials 14 and 16, and regardless of whether an earlier mask [e.g., 20] was used). Alternately, only a single mask may be used to form pillars 25 (not shown and less ideal).

Figure 14:
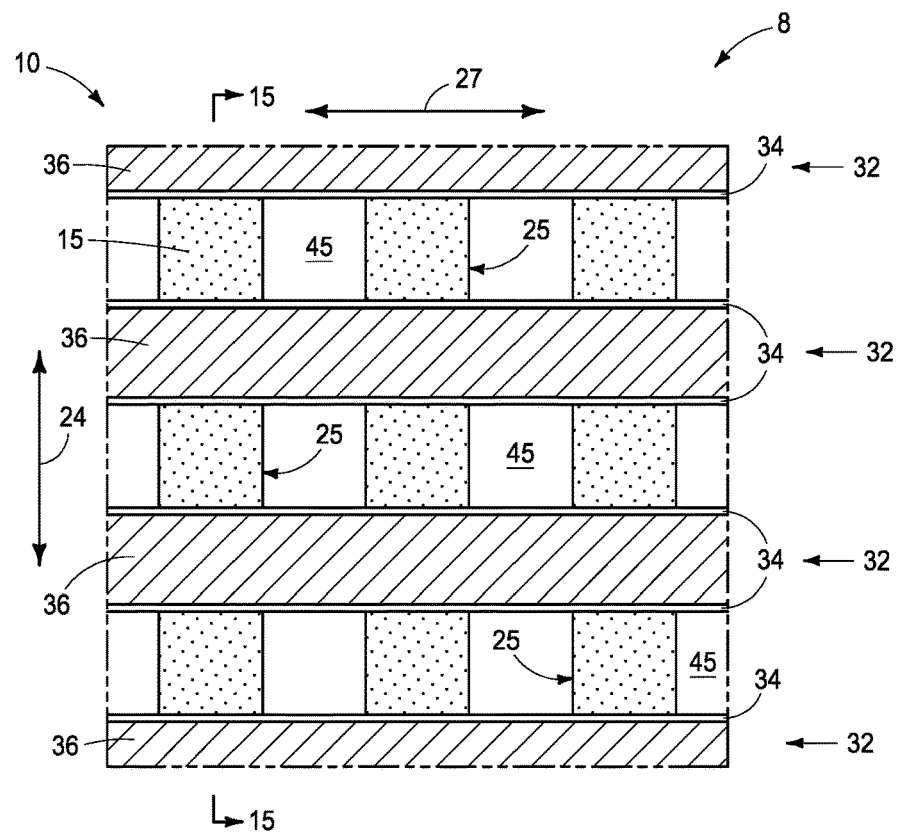
Figure 15:
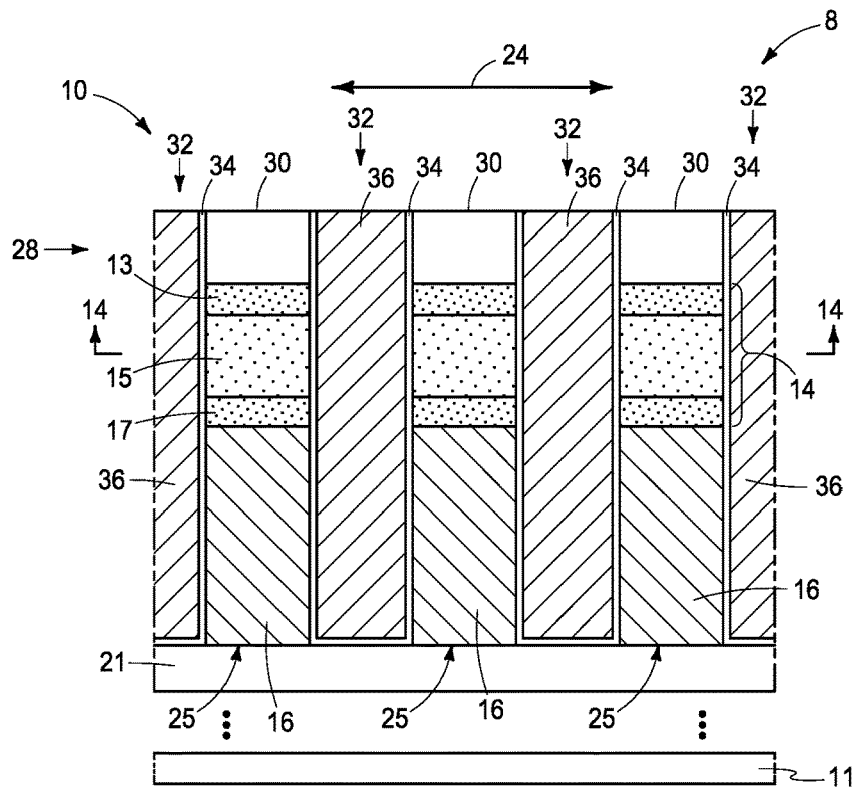

Referring to FIGS. 14 and 15, a capacitor insulator 34 (e.g., silicon dioxide, silicon nitride, high-k material, and/or ferroelectric material) has been formed in trenches 32 aside first capacitor electrode material 16 of pillars 25. A second capacitor electrode material 36 has been formed in trenches 32 laterally-outward of capacitor insulator 34. Second capacitor electrode material 36 and first capacitor electrode material 16 may be of the same composition or of different compositions relative one another. Such may be deposited to collectively line and overfill trenches 32 followed by planarizing such back at least to tops of mask lines 30 (e.g., when such remain at least at this point of the example method[s]).

Figure 16:
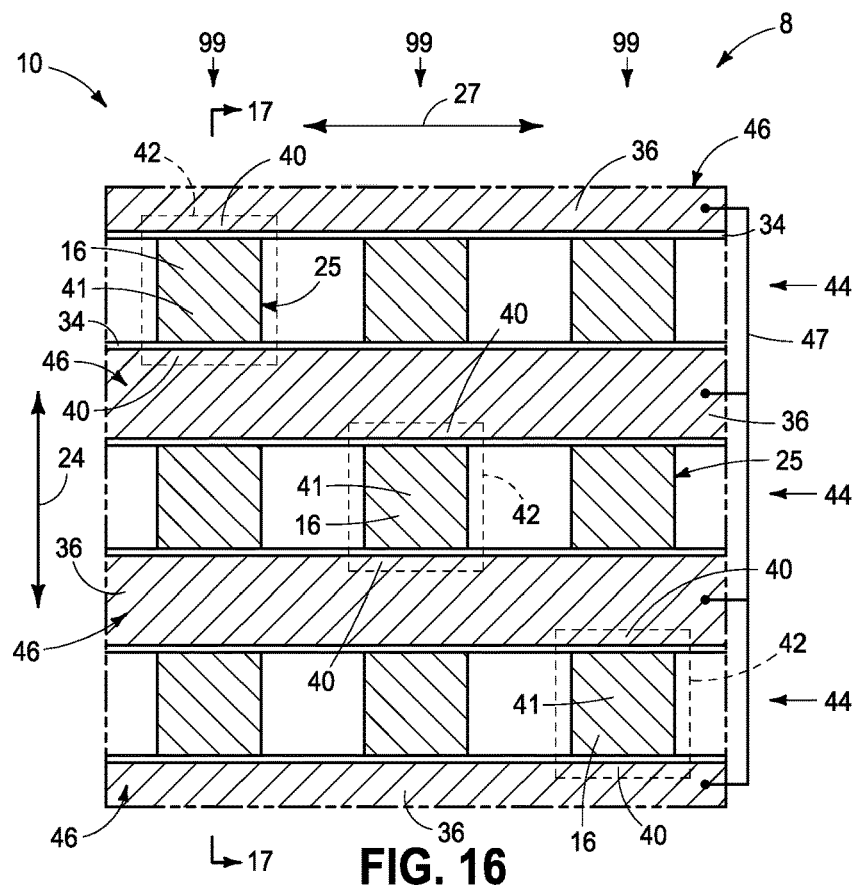
Figure 17:
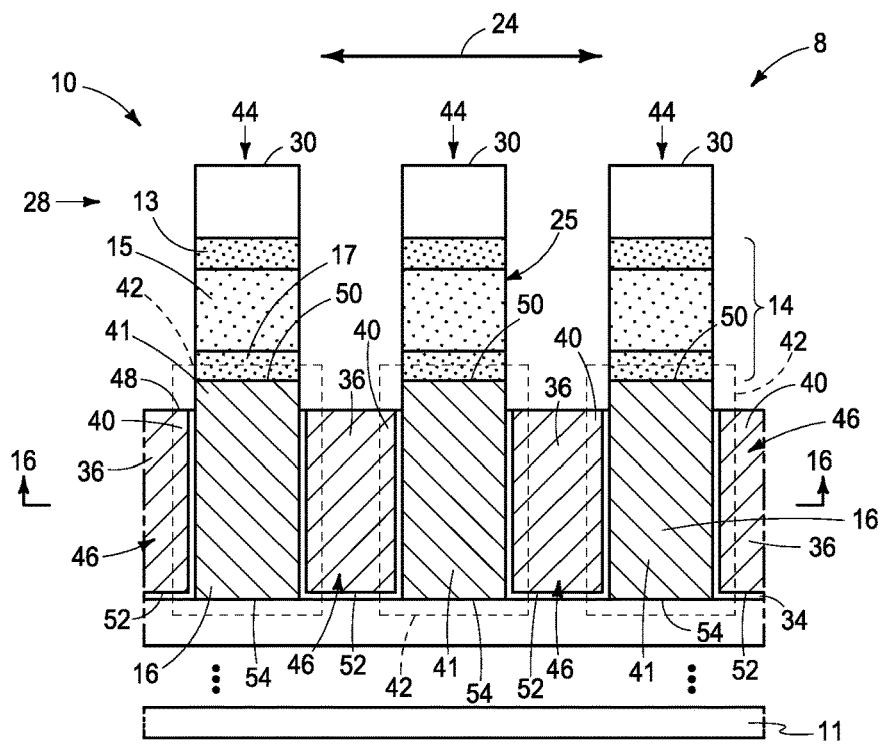

FIGS. 16 and 17 show vertical recessing (e.g., by etching) of second capacitor electrode material 36 (and in one embodiment also capacitor insulator 34) to form conductive lines 46 that are individually longitudinally-elongated horizontally and in individual trenches 32. Individual conductive lines 46 comprise a second capacitor electrode 40 of individual capacitors 42 that have been formed. In one embodiment and as shown, individual conductive lines 46 comprise a shared second capacitor electrode 40 of immediately-row-adjacent capacitors 42 (FIG. 17) and interconnect individual second capacitor electrodes 40 longitudinally along immediately-adjacent rows 44 of capacitors 42 (FIG. 16) (along individual conductive lines 46). First capacitor electrode material 16 of individual pillars 25 comprises a first capacitor electrode 41 of individual capacitors 42. In some embodiments, capacitors 42 may be considered as being arrayed in columns 99. In one embodiment, conductive lines 46 have tops 48 that are below tops 50 of first capacitor electrode material 16. In one embodiment, conductive lines 46 have bottoms 52 that are above bottoms 54 of first capacitor electrode material 16. In one embodiment, conductive lines 46 are directly electrically coupled together, for example as is schematically shown by an interconnect line 47 whereby, for example, second capacitor electrodes 40 are common to all capacitors 42 within array 10. Such interconnection may occur during, earlier than, or later than the example processing shown by FIGS. 16 and 17.

Figure 18:
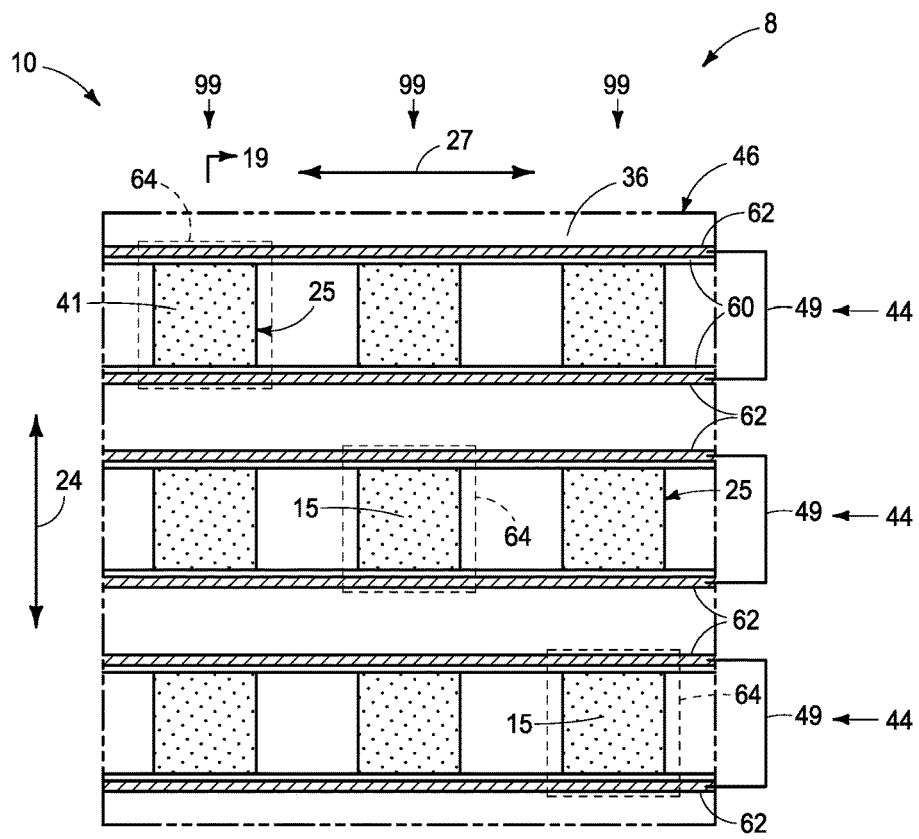
Figure 19:
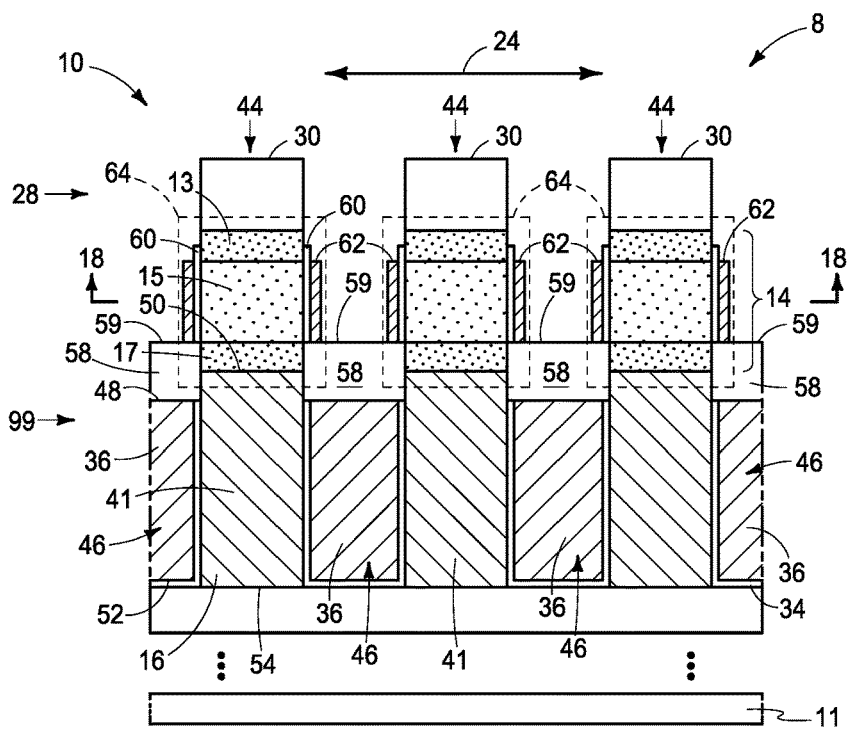

A plurality of gate lines 62 is formed above conductive lines 46, for example as is shown in FIGS. 18 and 19. Such show formation of insulator material 58 (e.g., silicon dioxide and/or silicon nitride) having a top surface 59 that has been used at least in part to define a bottom of gate lines 62. For example, FIGS. 18 and 19 show formation of gate insulator 60 followed by formation of gate lines 62 that extend along row direction 27. By way of example only, gate insulator 60 may be formed by a conformal deposition followed by an anisotropic spacer-like etch thereof, followed by deposition of conductive material for gate lines 62, and followed by an anisotropic spacer-like etch thereof. Alternately, as an example, gate insulator 60 might not be subjected to an anisotropic spacer-like etch prior to forming the conductive material of gate lines 62 (not shown). Such are but a couple of examples of forming a plurality of gate lines 62 above conductive lines 46, with gate lines 62 individually being operatively laterally-proximate channel regions (e.g., defined by channel region material 15) of transistor material 14 of pillars 25 and extending along row direction 27. Example gate lines 62 are shown as being on two of opposing sides of channel region material 15, although such may only be on one side thereof or may be gate-all-around (neither being shown in FIGS. 18 and 19). When on two opposing sides, individual pairs of such gate lines 62 may be directly electrically coupled together, for example as is schematically shown by a respective interconnect line 49. Regardless, transistor material 14 of individual pillars 25 and its laterally-proximate gate line(s) 62 comprise a vertical transistor 64.

Figure 20:
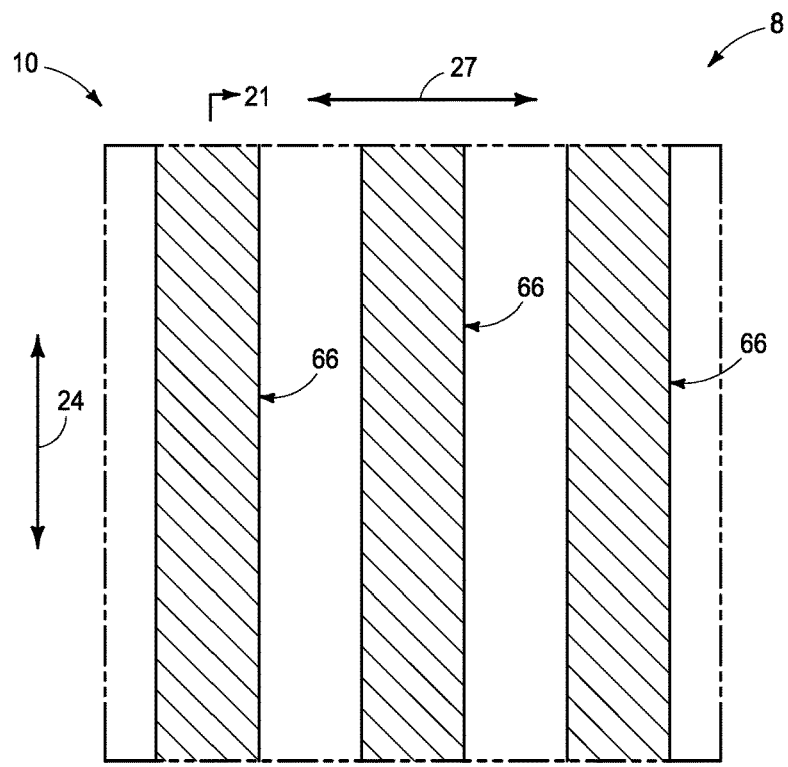
Figure 21:
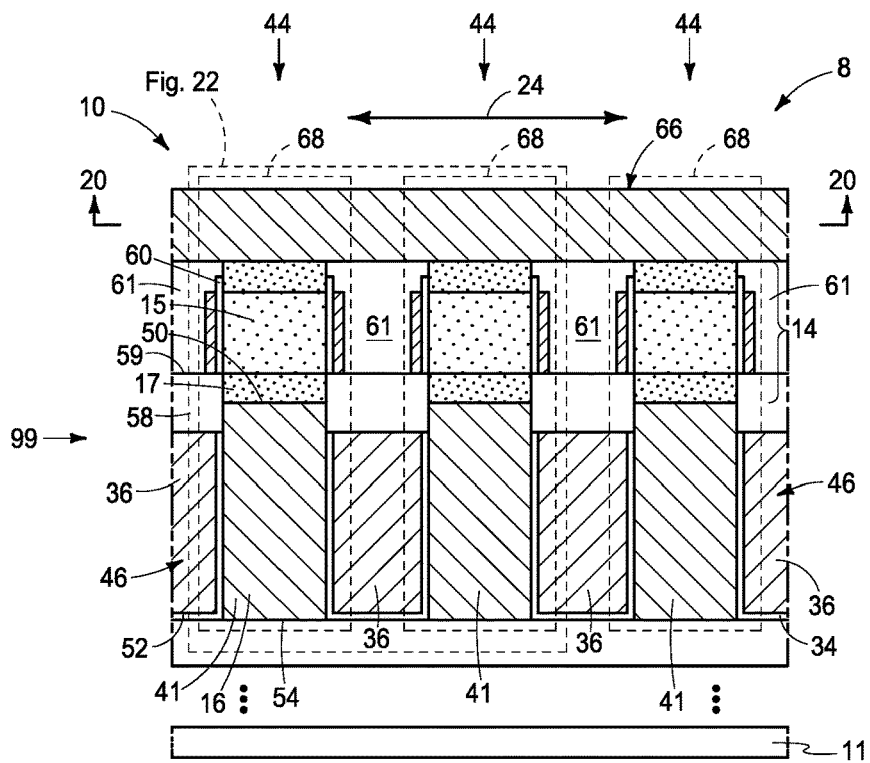
Figure 22:
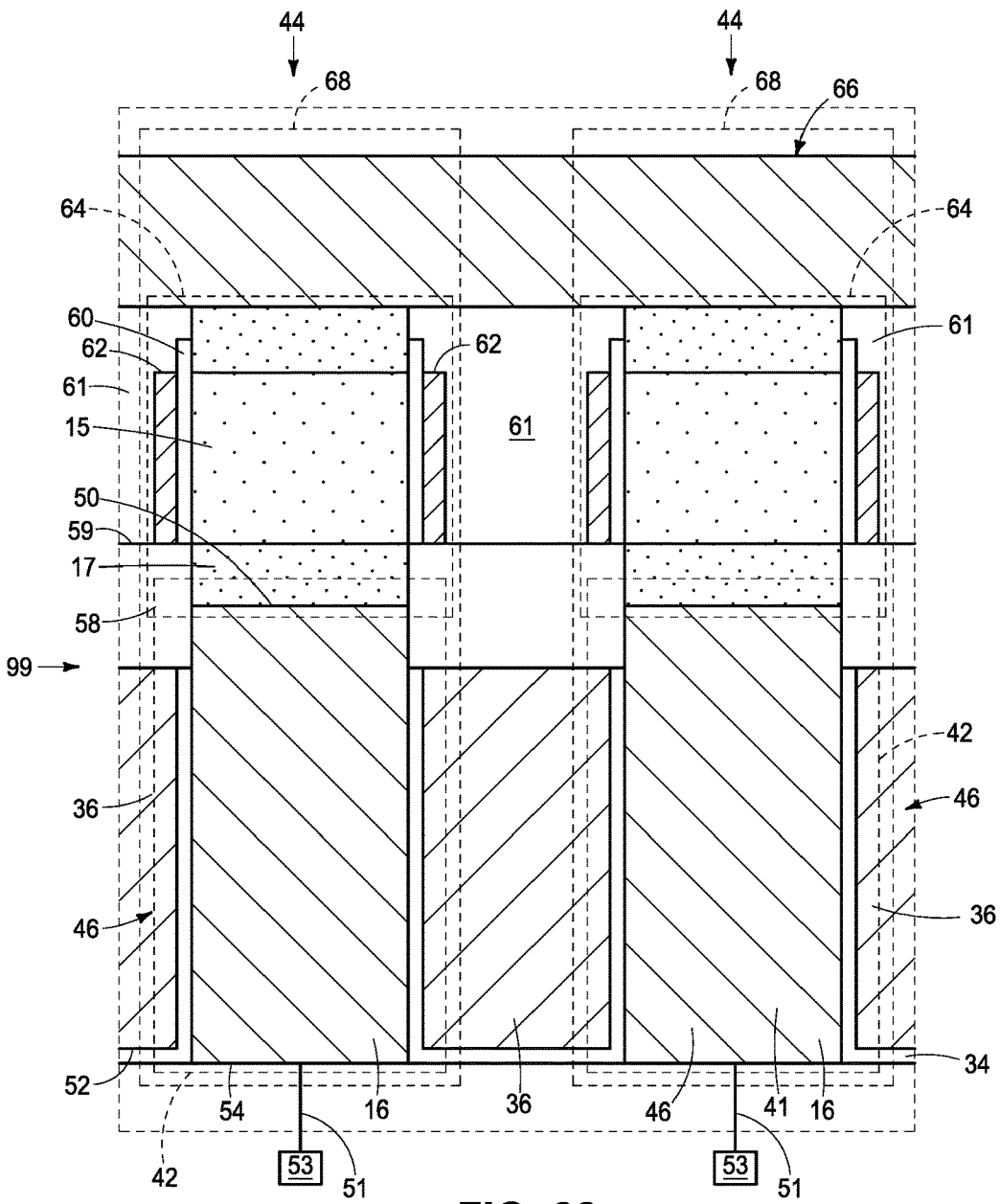

Referring to FIGS. 20-22, mask 28 (not shown) has been removed, insulator material 61 (e.g., silicon dioxide and/or silicon nitride) has been formed to fill space between vertical transistors 64, and thereafter a plurality of digitlines 66 has been formed that are individually above gate lines 62 and extend along column direction 24. Digitlines 66 individually are electrically coupled (e.g., directly electrically coupled) to individual vertical transistor 64 (e.g., to individual top source/drain regions 13). An array of memory cells 68 has thereby been formed with, in one embodiment, memory cells 68 individually comprising a single vertical transistor 64 and a single capacitor 42 (a 1T-1C memory cell). In one embodiment and as shown, conductive lines 46 individually are directly under individual gate lines 62 (FIGS. 21 and 22). In one embodiment, mask 28 (not shown) comprises sacrificial horizontal mask lines 30 and that are not removed until after forming gate lines 62.

Figure 23:
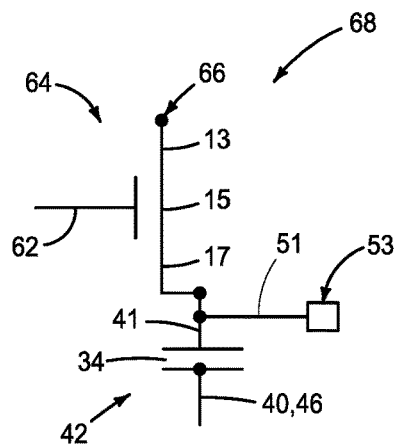

FIGS. 22 and 23 schematically show optional inclusion/addition of a select device 53 (e.g., any suitable select device such as a diode, transistor, etc.) connected to first capacitor electrode 41 by an interconnect line 51.

Processing as described above whereby transistor material and first capacitor electrode material there-below are patterned at the same time (e.g., in an etching step using mask 28 in a single common masking step for the etching of materials 14 and 16, and regardless of whether an earlier mask [e.g., 20] was used) may reduce the number of critical masks and attendant critical alignments thereof.

Any other attribute(s) or aspect(s) as shown and/or described herein with respect to other embodiments may be used in the embodiments shown and described with reference to the above embodiments.

An alternate example method is next described with reference to FIGS. 24-37 with respect to a construction 8a of an array 10a in fabrication. Like numerals from the above-described embodiments have been used where appropriate, with some construction differences being indicated with the suffix "a" or with different numerals.

Figure 24:
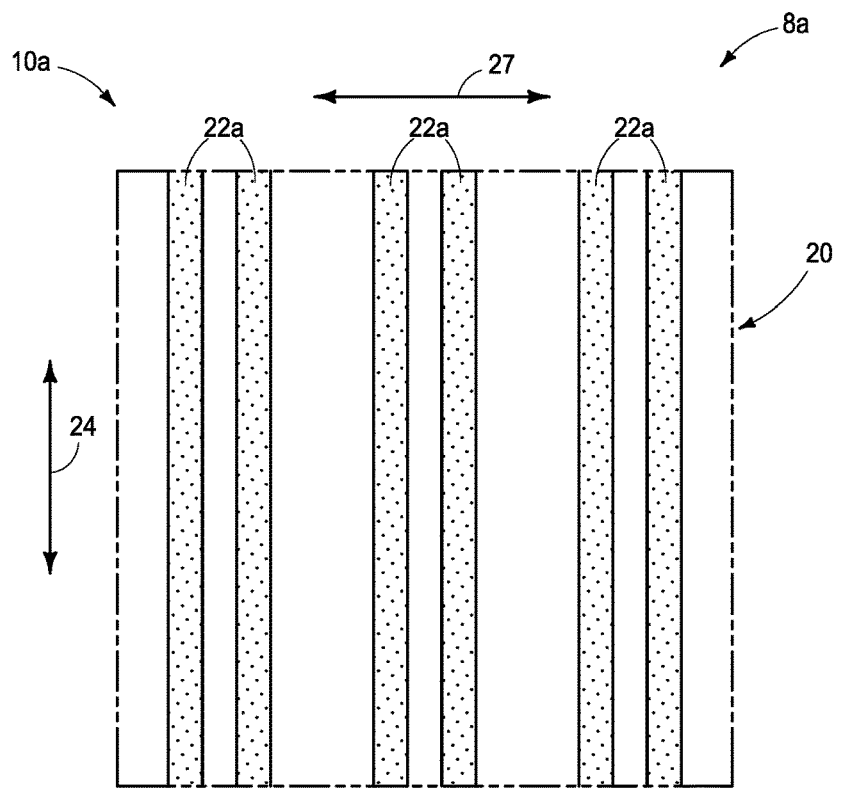
Figure 25:
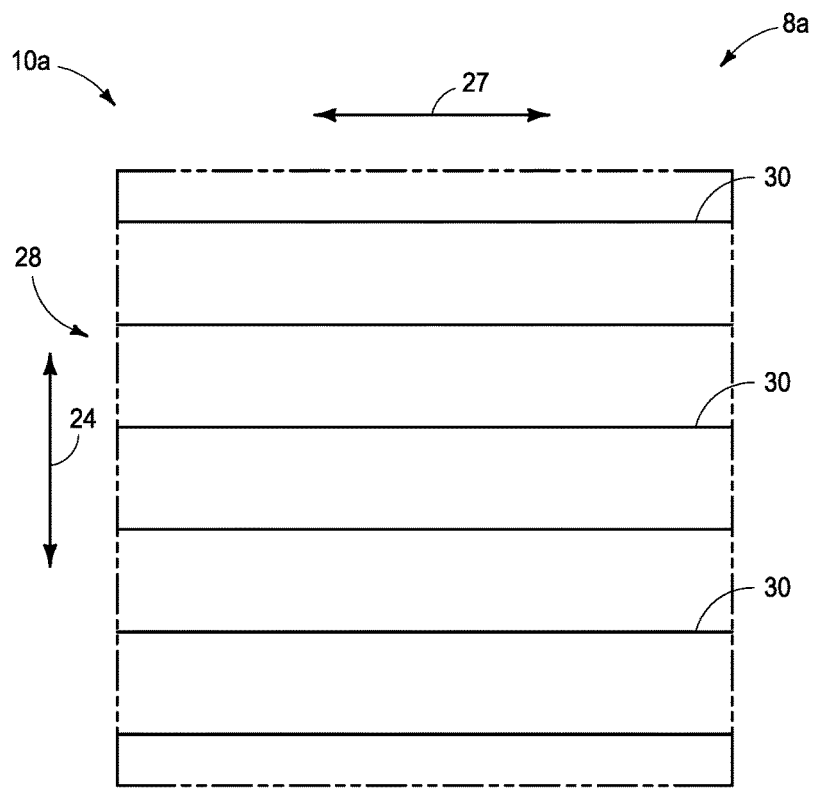

FIG. 24 corresponds in processing sequence to that of FIG. 2, with mask lines 22a being shown with peppering for clarity. FIG. 25 corresponds in processing sequence to that of FIG. 8. Further, for ease of representation, mask lines 30 in FIG. 25 are shown as being of the same width as in FIG. 8. Mask lines 22a in FIG. 24 are shown as being one third the width as shown in FIG. 2 and as being of a different x/y-axis layout. Alternate layouts and widths may be used, for example and by way of example only with mask lines 22a being of the same width and x/y layout as in FIG. 24 (not shown) and mask lines 30 in FIG. 25 being wider than shown. Regardless, and in one embodiment, mask lines 30 of mask 28 are wider than mask lines 22a of mask 20a than in the above-described embodiments and resultant individual pillars 25a (at least initially and not-yet-shown) will thereby be of different horizontal cross-sectional shape than that with respect to the first-described embodiments (e.g., being horizontally-elongated [e.g., rectangular] as opposed to an example horizontally square shape as shown by way of example in the first-described embodiments and as will be apparent from the continuing discussion).

Figure 26:
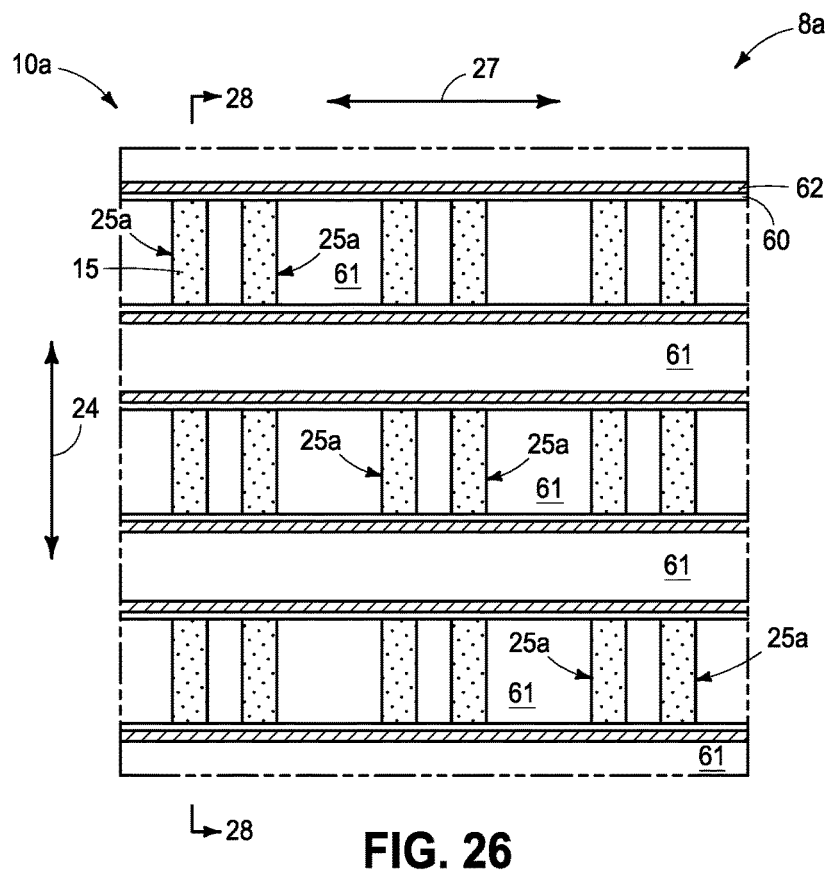
Figure 27:
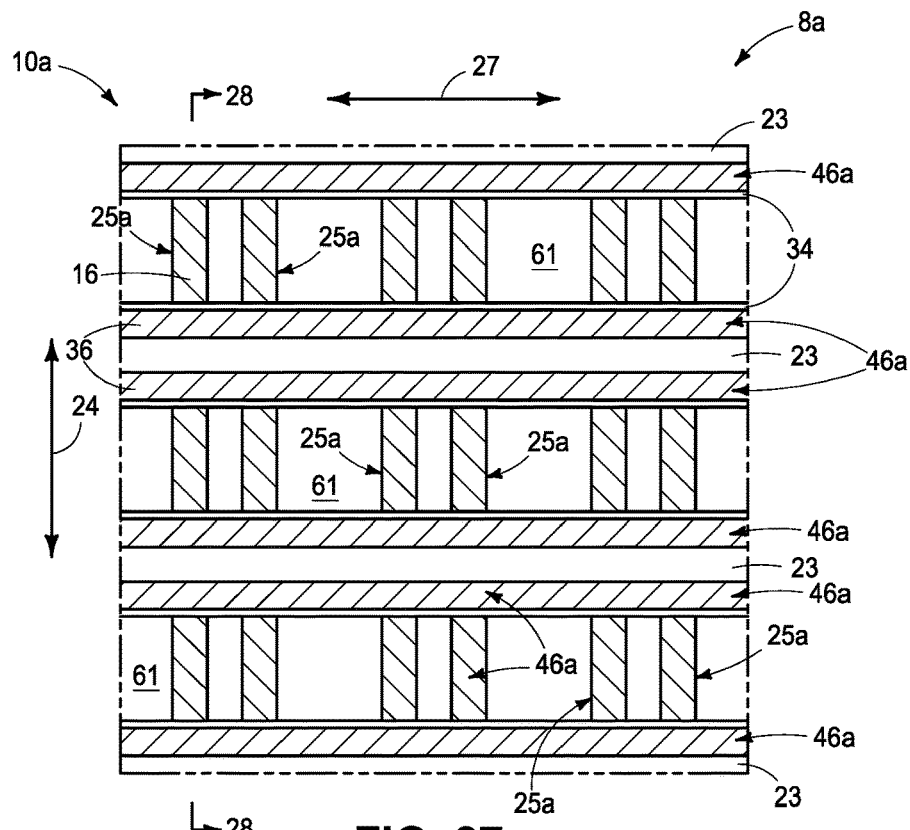
Figure 28:
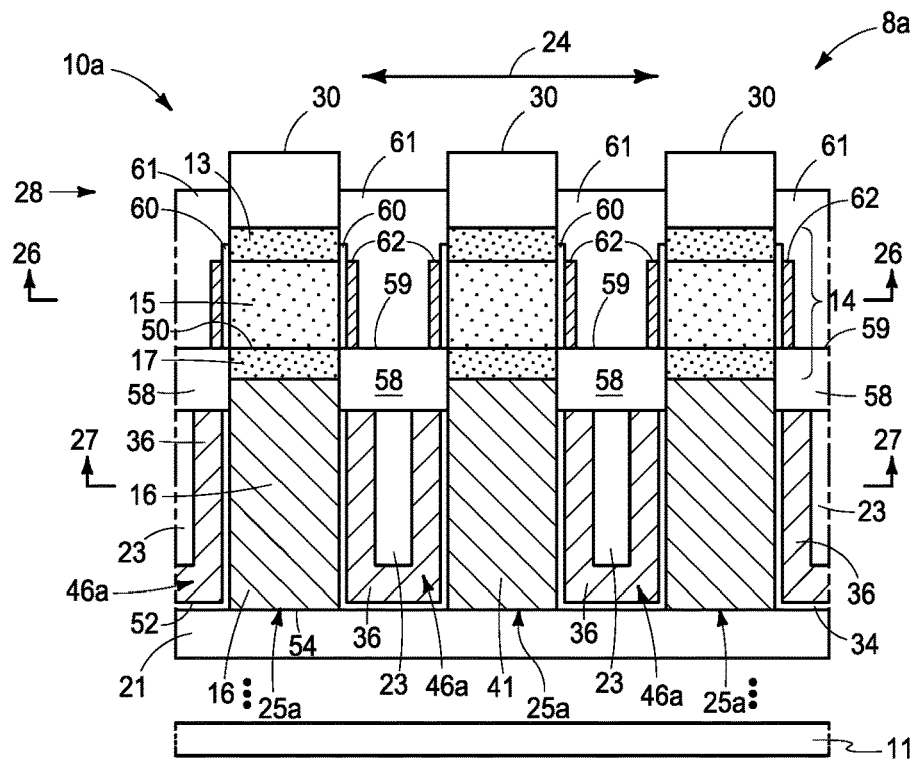

FIGS. 26-28 show subsequent example processing largely corresponding to that described above through and to FIGS. 18 and 19 of construction 8. Pillars 25a have been formed which in some embodiments may be considered as first pillars 25a. Insulator material 61 has been formed and additionally has then been vertically recessed relative to mask lines 30. In some embodiments, insulator material 61 may be considered as being masking material (e.g., at least part of a masking material) that has been formed aside mask lines 30. In one example embodiment and as shown, alternate example conductive lines 46a have been formed that have a trough-like shape (e.g., in a vertical cross-section as shown in FIG. 28), and in such one embodiment, with the trough thereof being filled with solid insulator material 23 (e.g., silicon dioxide and/or silicon nitride).

Figure 29:
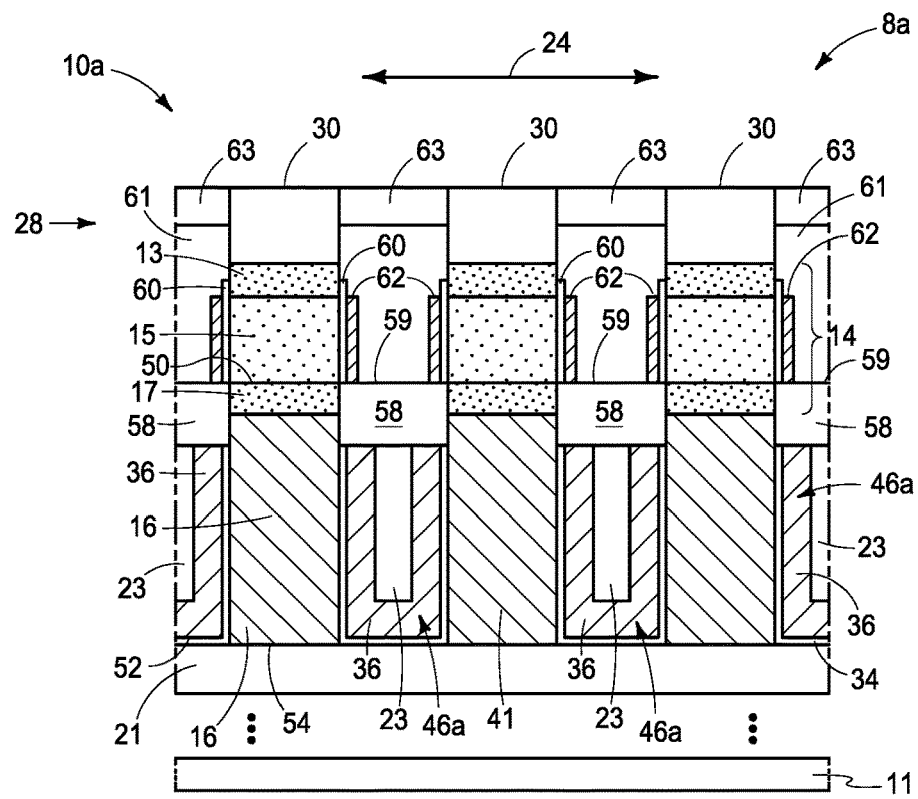

Referring to FIG. 29, masking material 63 (e.g., silicon carbide) has been formed atop insulator material 61 aside mask lines 30. Such may be formed, for example, by deposition of material 63 to overfill void space left from the recessing of insulator material 61 followed by planarizing material 63 back at least to top surfaces of mask lines 30.

Figure 30:
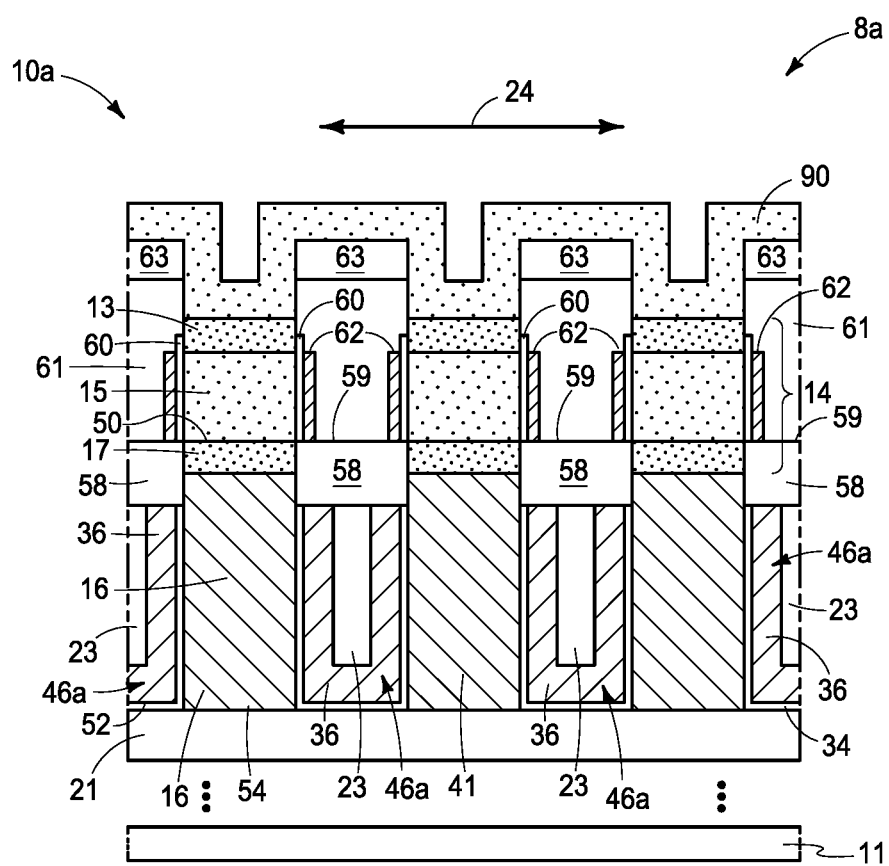
Figure 31:
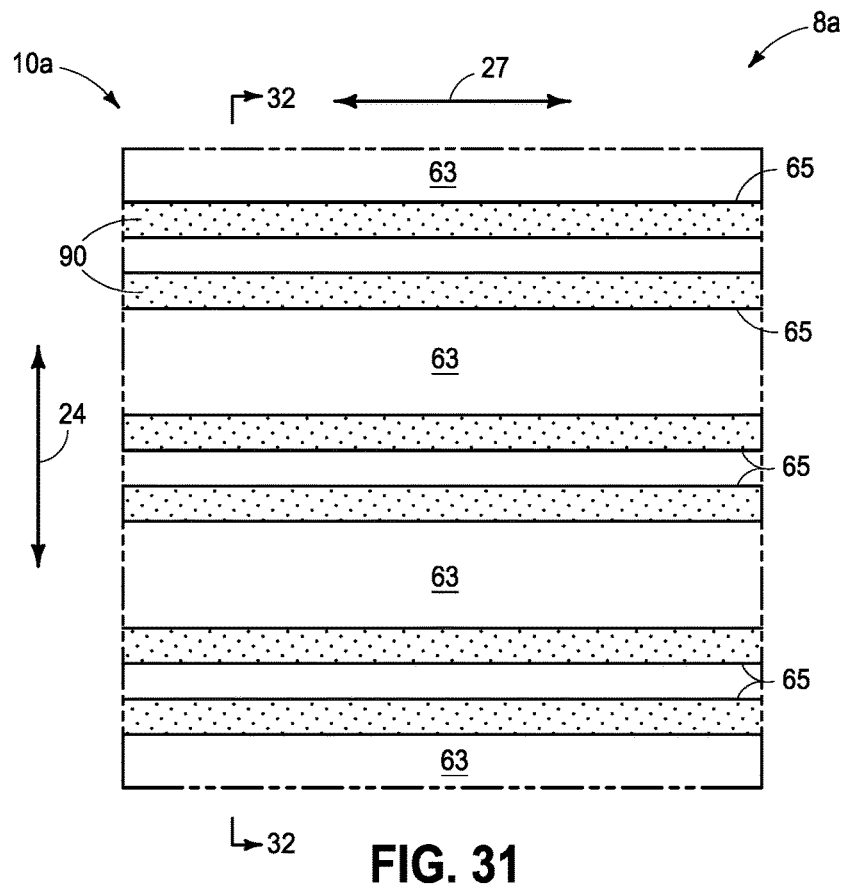
Figure 32:
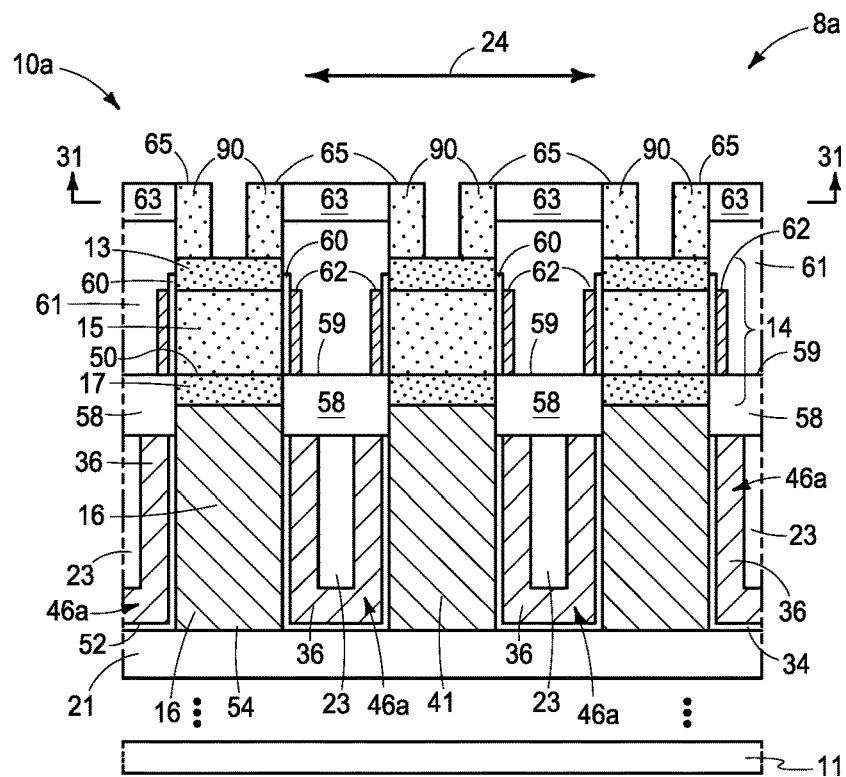

Referring to FIG. 30, mask lines 30 (not shown) have been removed and a conformal layer of material 90 (e.g., silicon nitride) has been deposited to less-than-fill void space in masking material 61 and/or 63 resulting from the removal of mask lines 30. FIGS. 31 and 32 show material 90 having been subjected to a spacer-like etch to form sidewall-spacer lines 65 in such void space.

Figure 33:
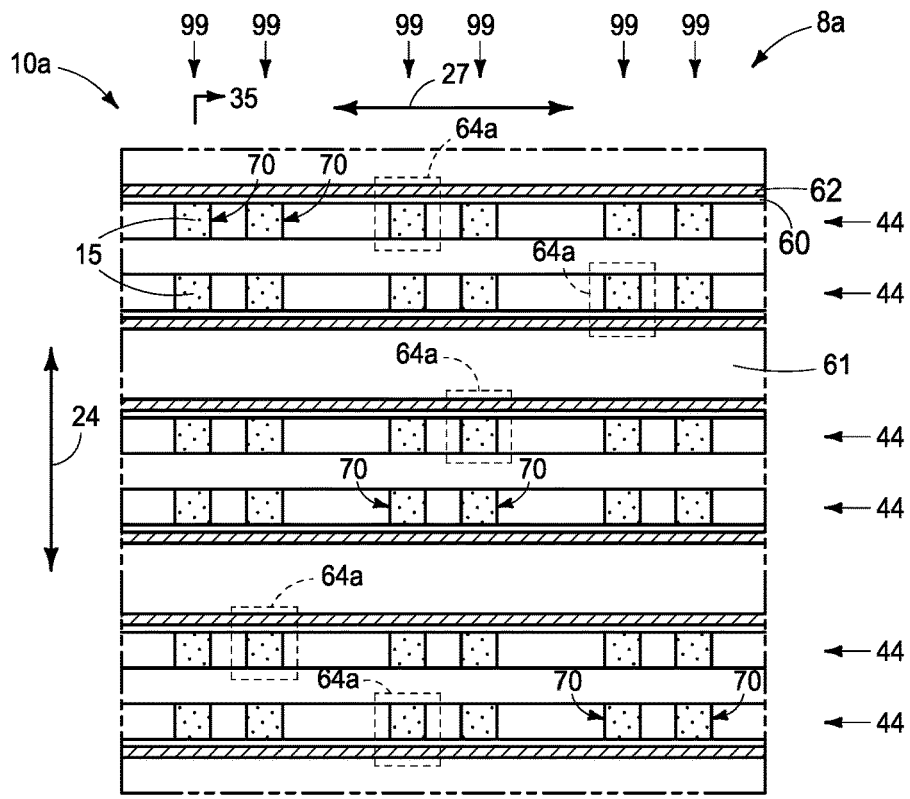
Figure 34:
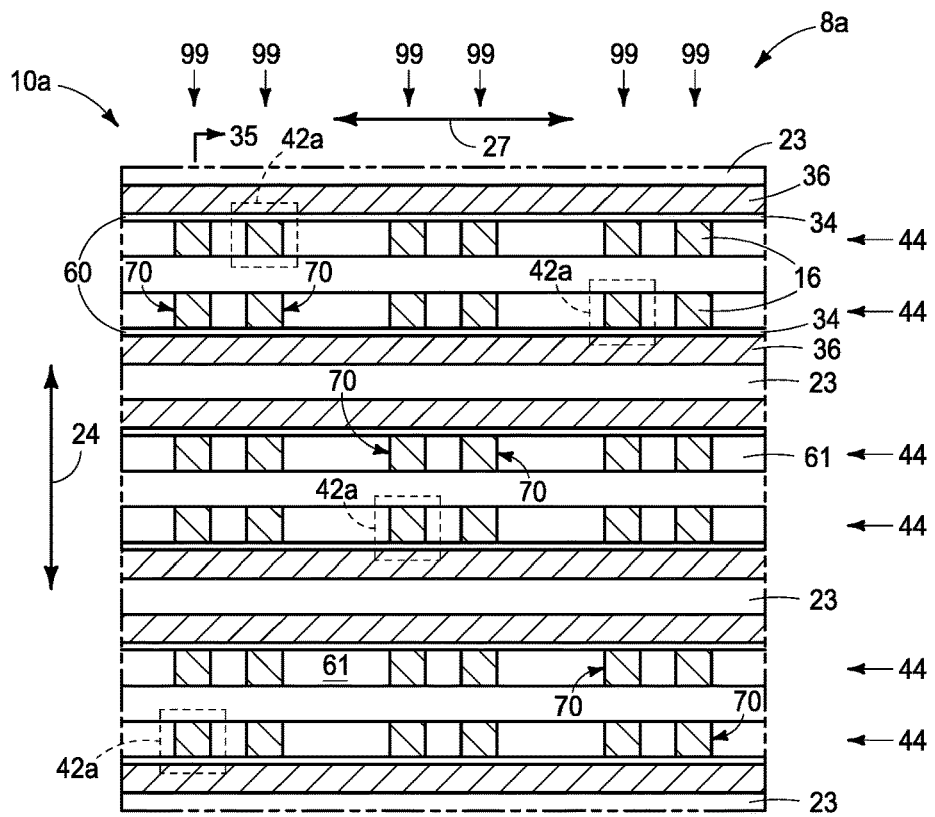
Figure 35:
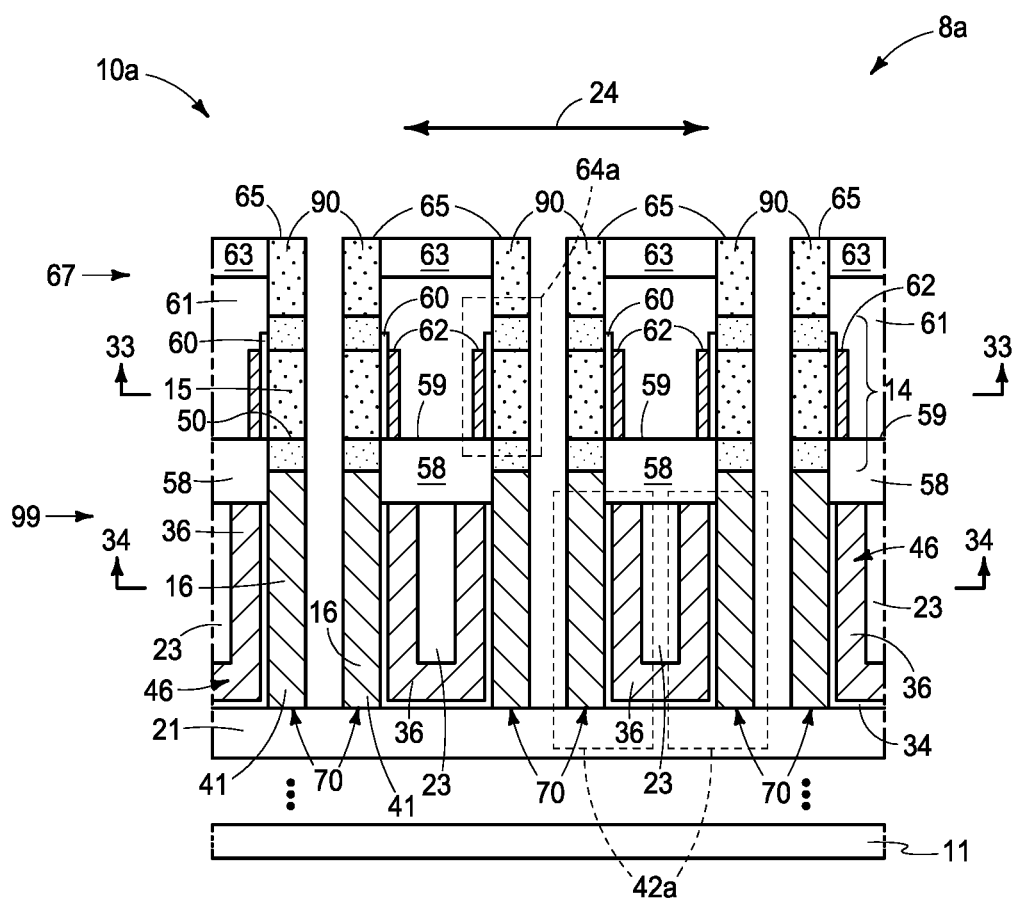
Figure 36:
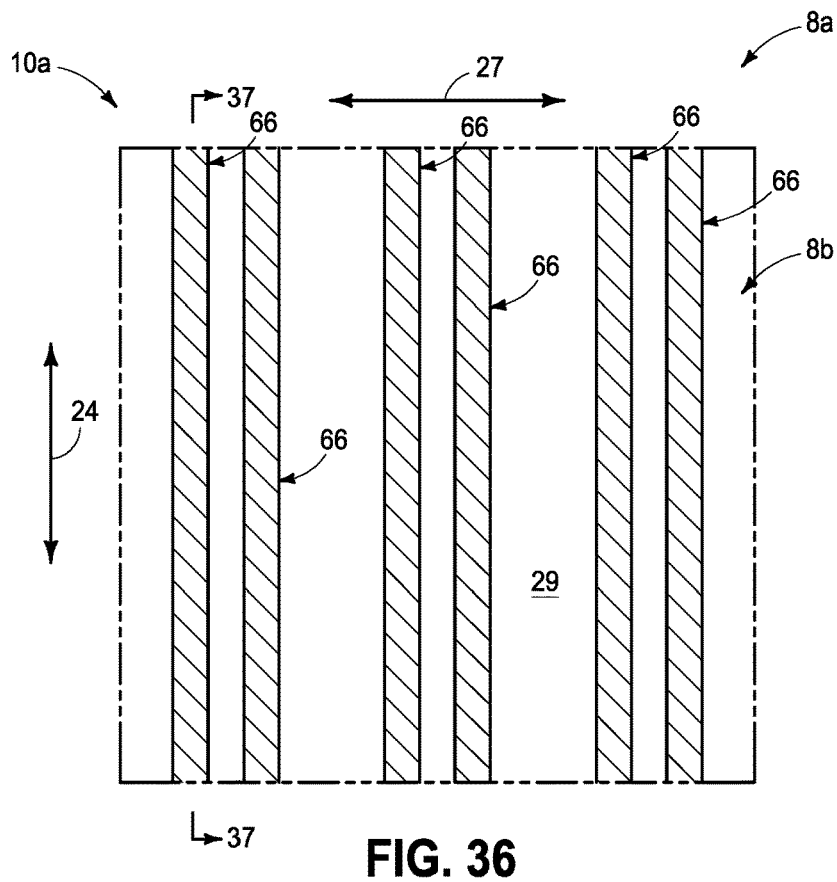
Figure 37:
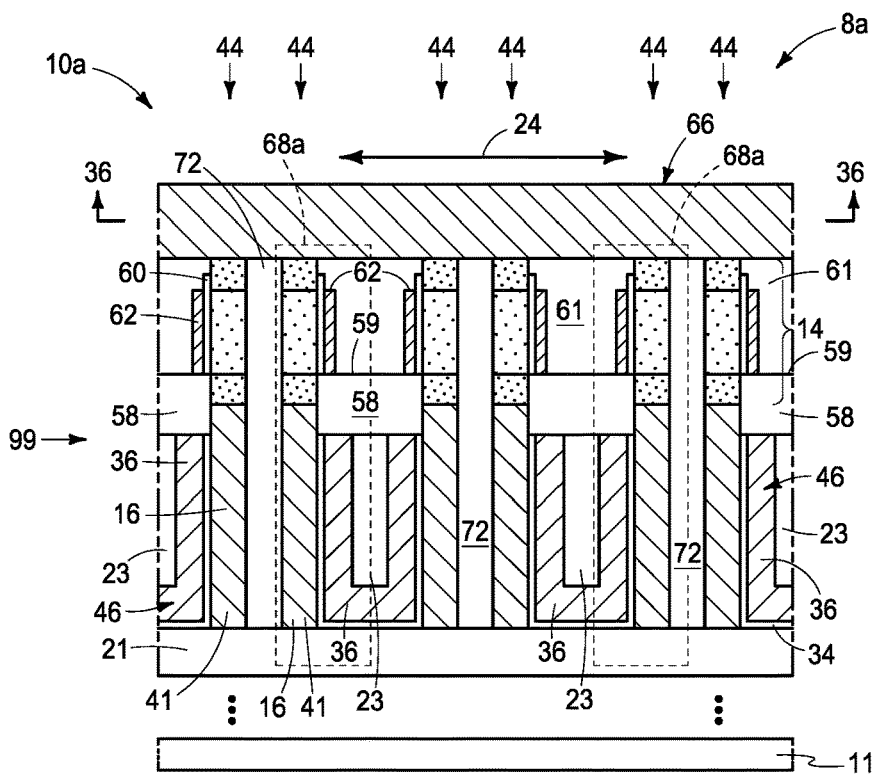

Referring to FIGS. 33-35, masking material 63 and sidewall-spacer lines 65 have been used to comprise a mask 67 while etching first pillars 25a (not so designated in FIGS. 33-35) to bifurcate them into two second pillars 70 that individually comprise a vertical transistor 64a. FIGS. 36 and 37 show example subsequent removal of masking material 63 (not shown) and sidewall-spacer lines 65 (not shown), followed by formation of insulator material 72 (e.g., silicon dioxide and/or silicon nitride) and digitlines 66. Accordingly, and in some embodiments, capacitors 42*a* and/or memory cells 68*a* have also been formed.

In one embodiment and as shown, such bifurcating has occurred after forming gate lines 62. In one embodiment and as shown, individual gate lines 62 are operatively laterally-adjacent only one side of the channel region (e.g., material 15) of individual vertical transistors 64*a*. Regardless, and in one embodiment, the bifurcating occurs after forming capacitor insulator 34 and after forming second capacitor electrode material 36.

Any other attribute(s) or aspect(s) as shown and/or described herein with respect to other embodiments may be used.

Another example embodiment method used in forming an array of memory cells is next described with reference to FIGS. 38-50. Like numerals from the above-described embodiments have been used where appropriate, with some construction differences being indicated with the suffix "b" or with different numerals.

Figure 38:
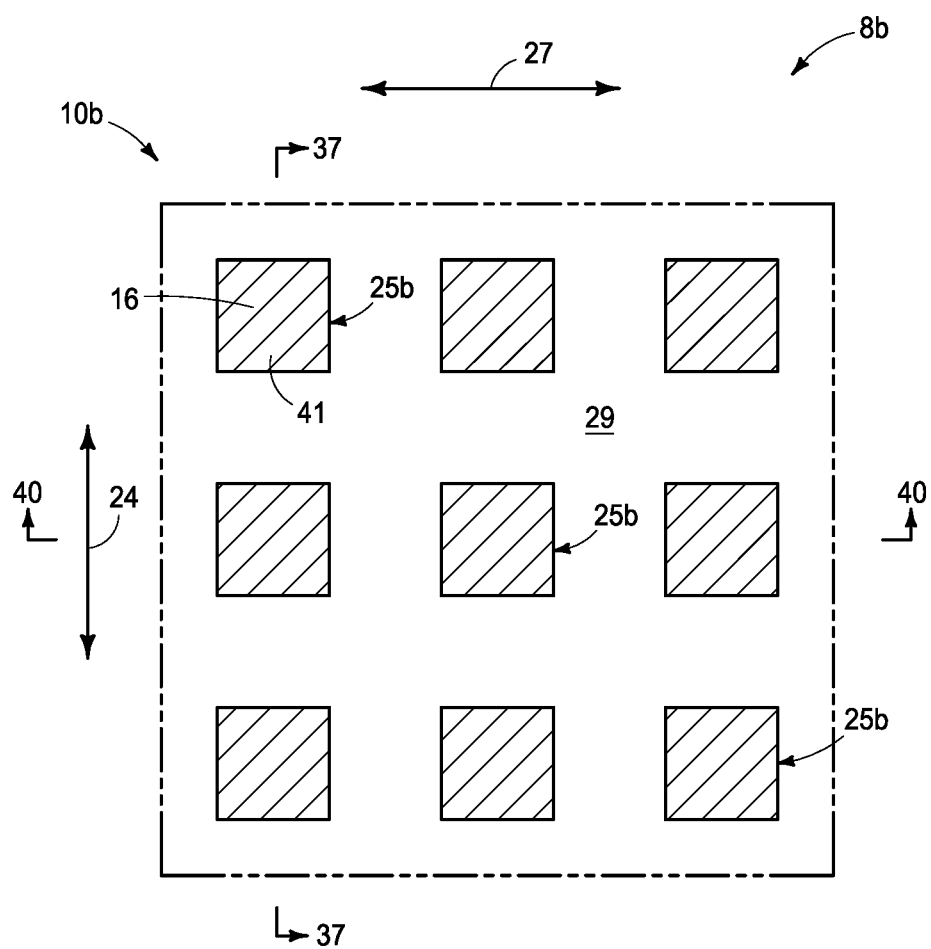
Figure 39:
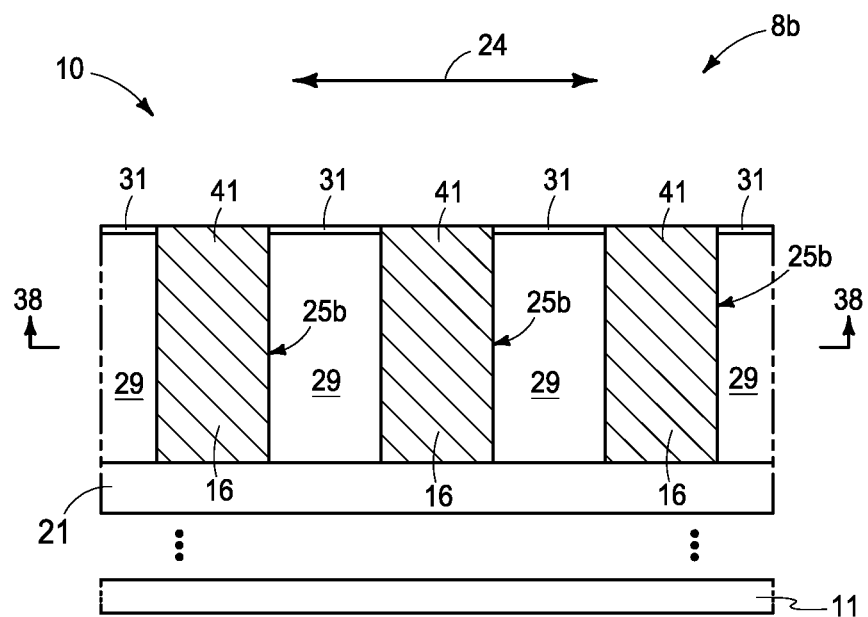
Figure 40:
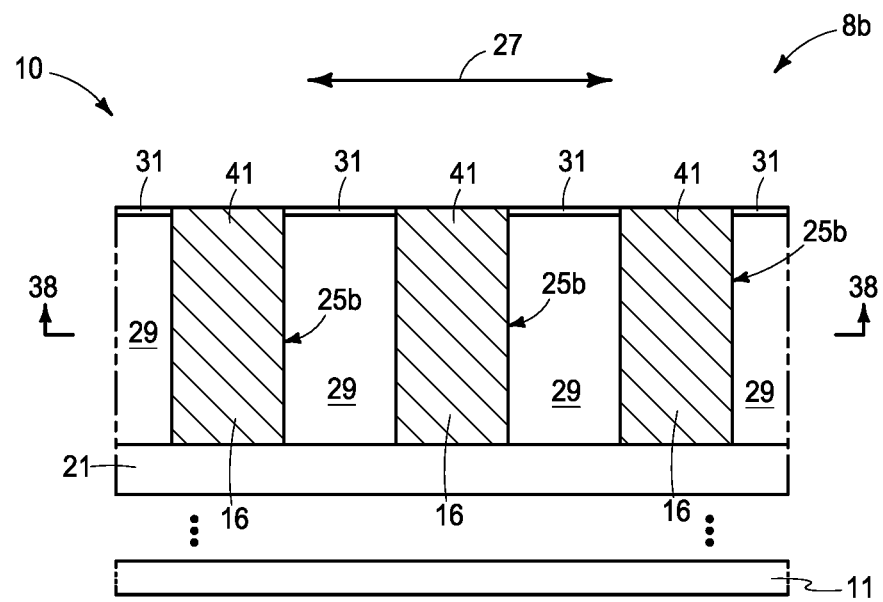
Figure 41:
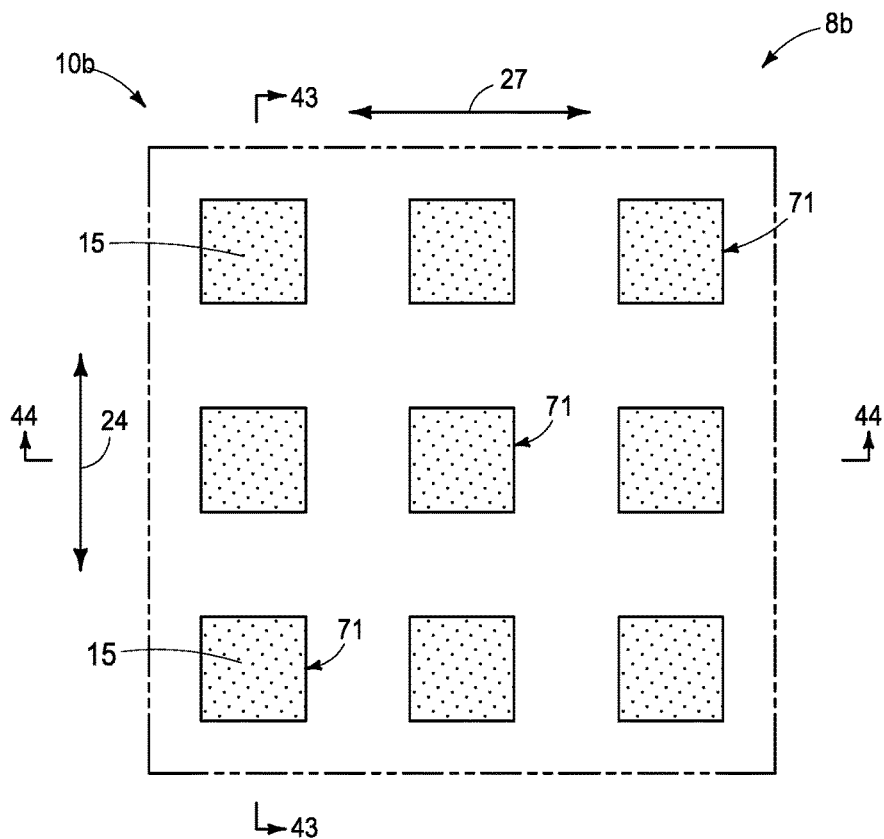
Figure 42:
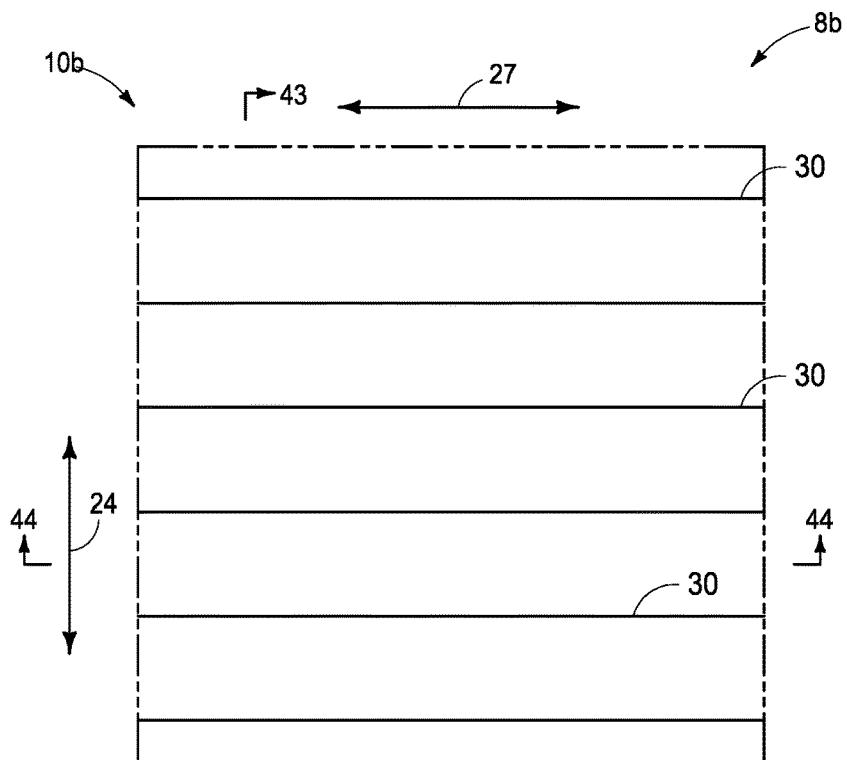
Figure 43:
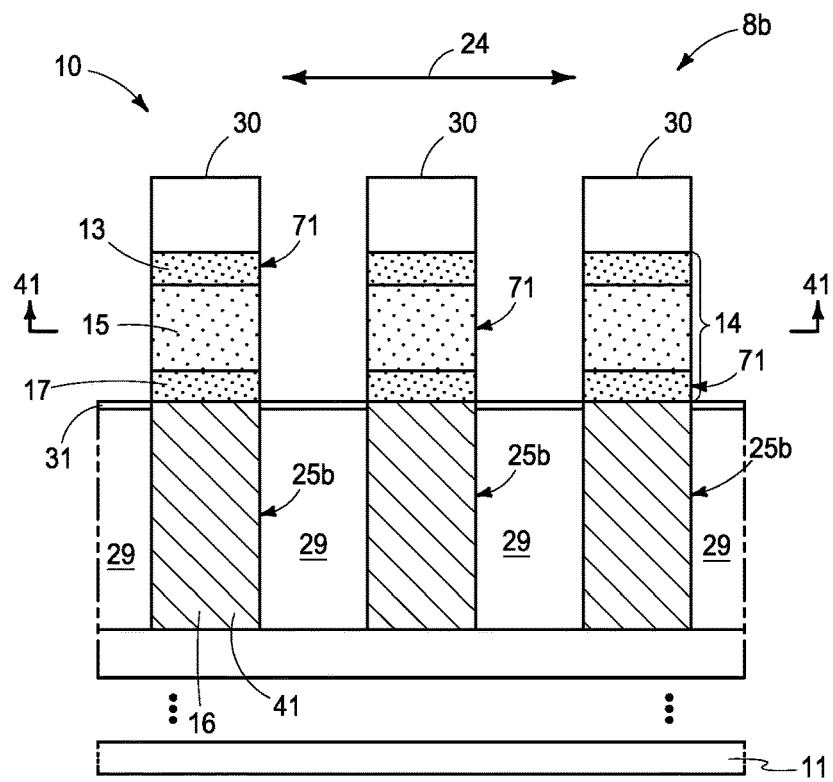
Figure 44:
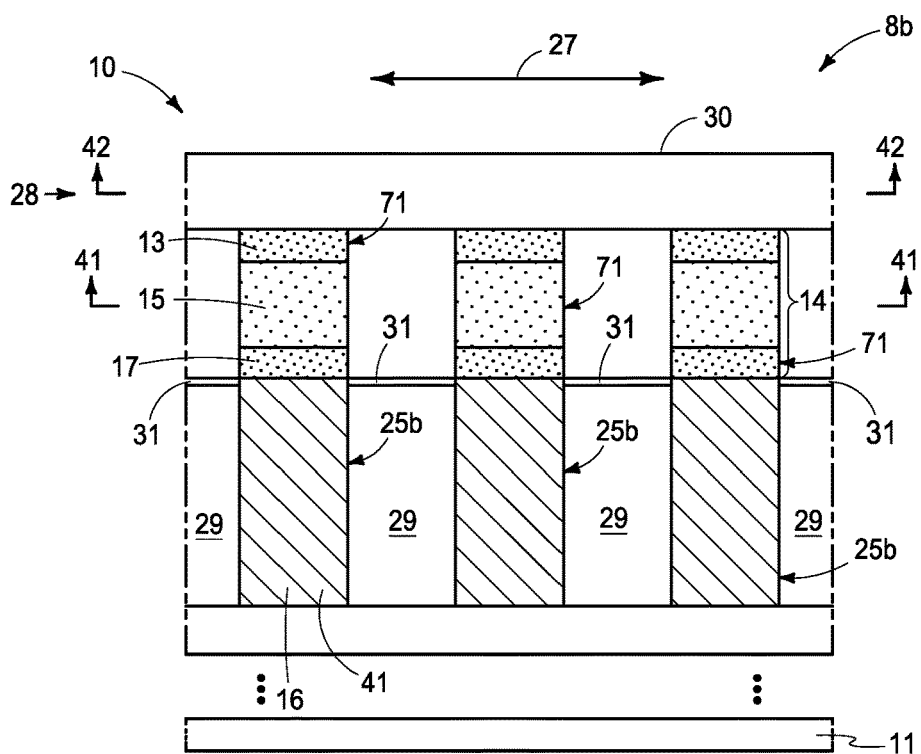

Referring to FIGS. 38-40, a plurality of first pillars 25*b* have been formed that individually comprise first capacitor electrodes 41. Sacrificial material 29 (e.g., silicon dioxide) has been formed laterally about first pillars 25*b*. In one embodiment, an etch-stop material 31 (e.g. silicon nitride) has been formed atop sacrificial material 29.

A plurality of vertical transistors is formed above the sacrificial material and above the first pillars. FIGS. 41-44 show example formation of second pillars 71 directly above and that are directly electrically coupled to first pillars 25*b* (e.g., largely analogous to processing described with respect to the first-described embodiments). Second pillars 71 individually comprise a channel region (e.g., channel region material 15) and a top source/drain region (e.g., top source/drain region material 13) there-above. In one embodiment and as shown, second pillars 71 also individually comprise a bottom source/drain region 17 directly below the channel region and directly against one of first pillars 25*b*.

Figure 45:
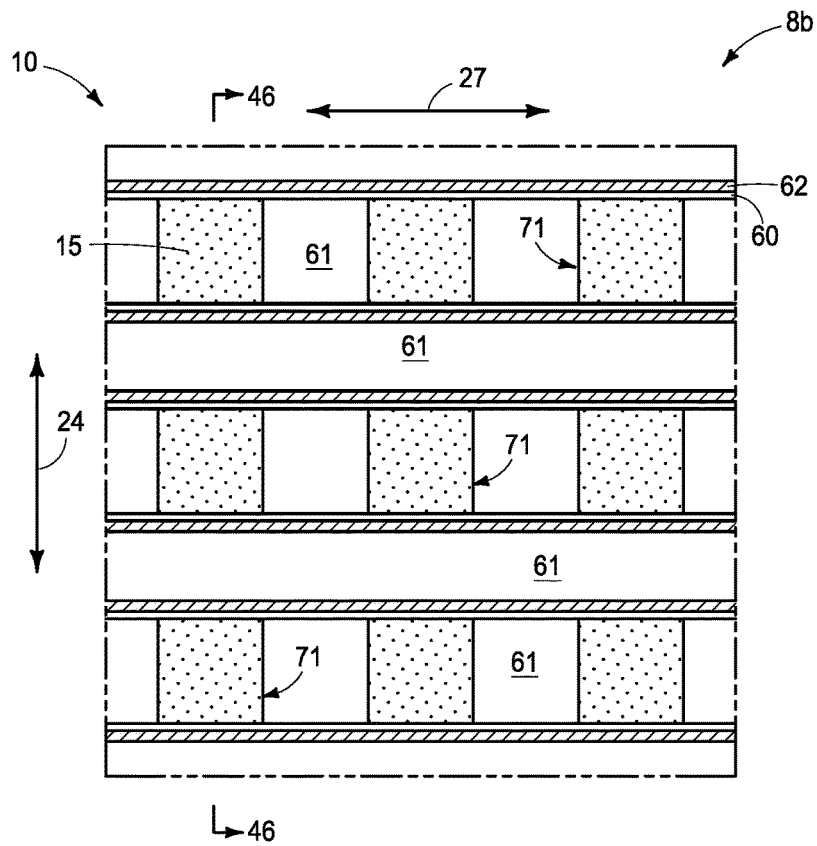
Figure 46:
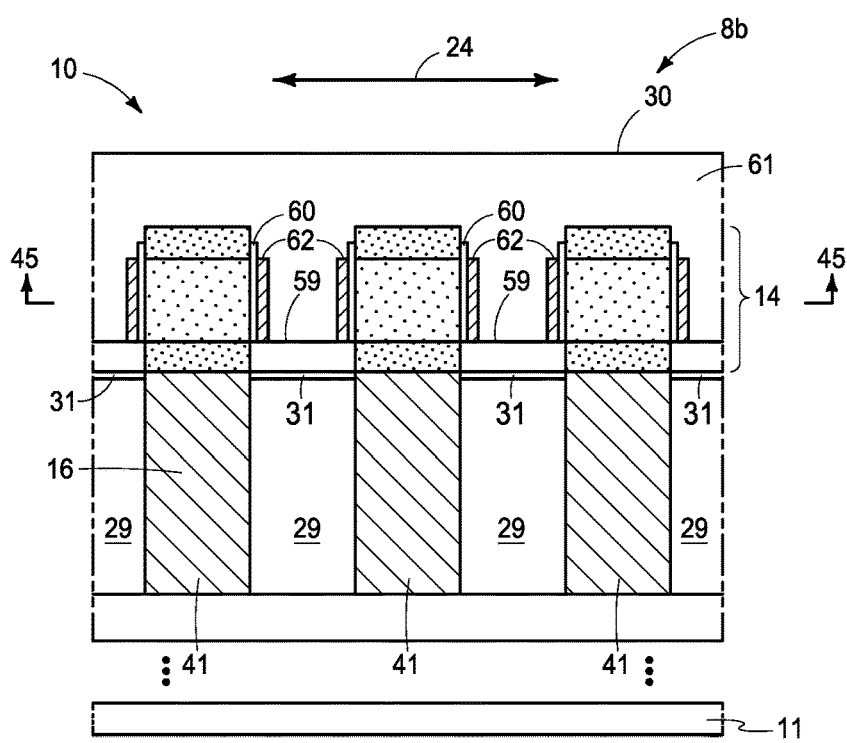
Figure 47:
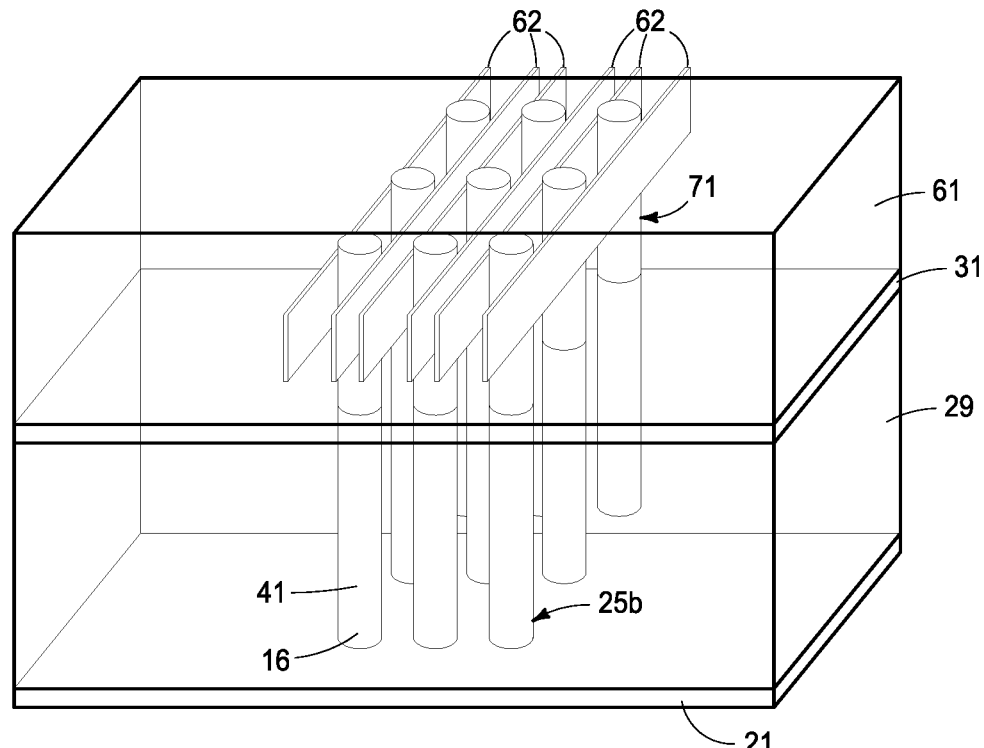

FIGS. 45 and 46 show subsequent example processing largely corresponding to that described above through and to FIGS. 18 and 19 of construction 8. Mask lines 30 (not shown) have been removed and insulator material 61 covers sides and tops of second pillars 71, gate insulator 60, and gate lines 62. FIG. 47 is a very diagrammatic, reduced-scale, transparent, and perspective representation of construction 8*b* of FIGS. 45 and 46, First pillars 25*b* and second pillars 71 are shown as being circular in horizontal cross-section for clarity and ease of depiction.

Figure 48:
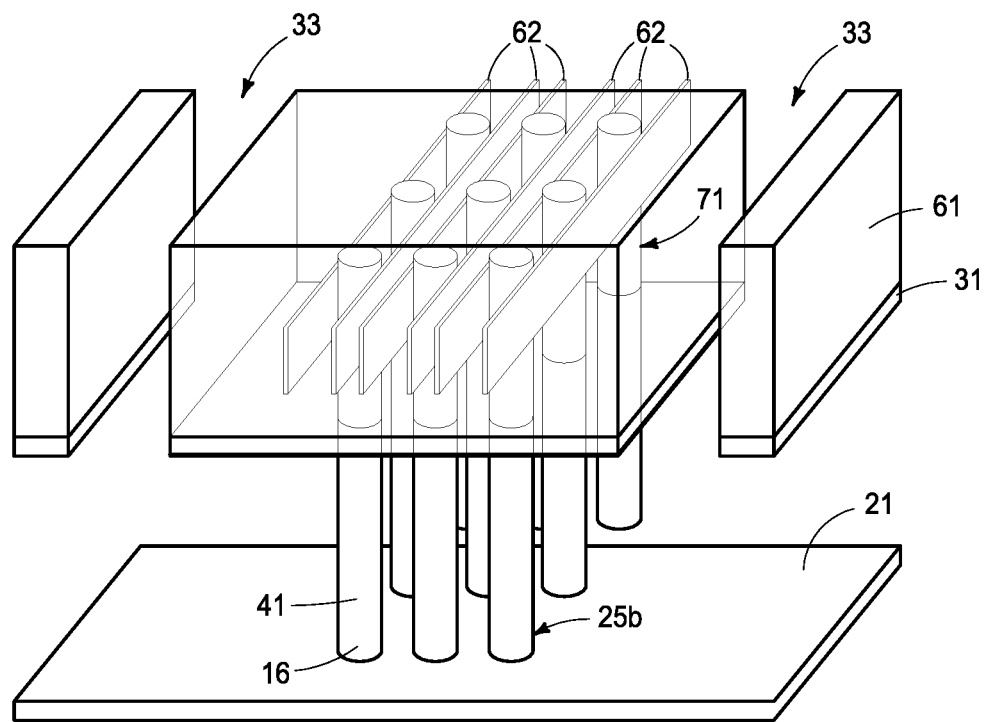

Referring to FIG. 48, such is a figure like that of FIG. 47 but showing example subsequent processing to that shown by FIGS. 45-47. Access openings 33 have been formed through insulator material 61 and through etch-stop material 31 (when present). Thereafter, sacrificial material 29 (not shown) has been removed from being laterally about first capacitor electrodes 41 (e.g., by isotropic etching selectively relative to materials 61, 31, and 16).

Figure 49:
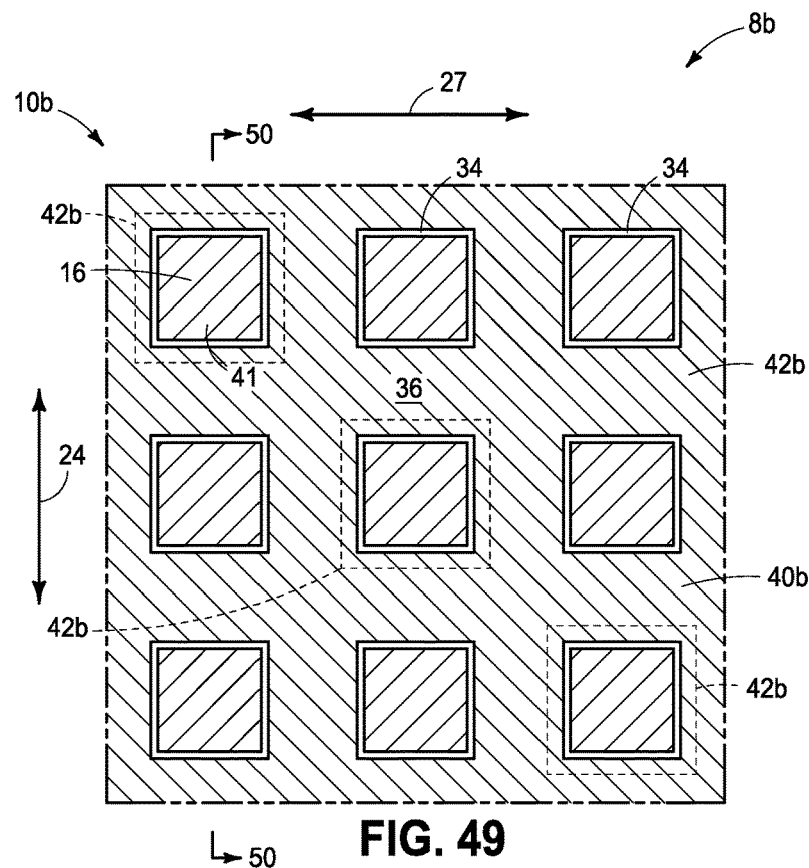
Figure 50:
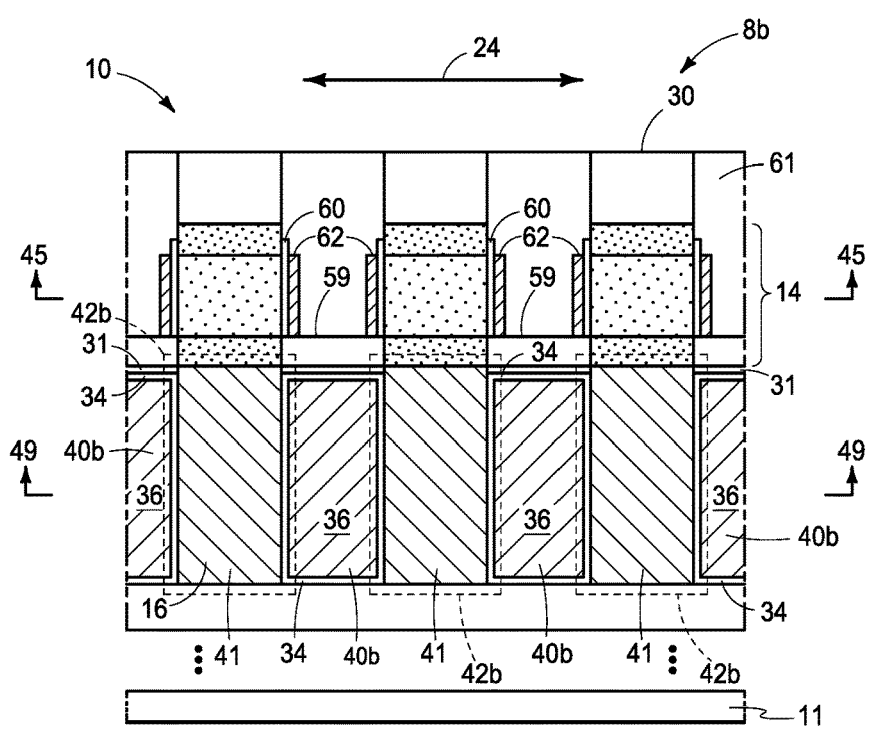

Referring to FIGS. 49 and 50, such show subsequent processing whereby capacitor insulator 34 and second capacitor electrode material 36 have been formed. Accordingly, and in one example, second capacitor electrode material 36 forms a common second capacitor electrode plate 40*b* that is laterally about first capacitor electrodes 41 as opposed to being conductive lines running laterally there-adjacent. Capacitors 42*b* (FIG. 49) have thereby been formed. Digitlines (not shown) can be formed to directly electrically couple with vertical transistors 64 as described above with respect to other embodiments. Further, any other attribute(s) or aspect(s) as shown and/or described herein with respect to other embodiments may be used.

In one embodiment, a method used in forming an array (e.g., 10) of memory cells (e.g., 68, 68*a*) comprises forming a vertical stack (e.g., 12) comprising transistor material (e.g., 14) directly above and directly against a first capacitor electrode material (e.g., 16), A mask (e.g., 28, 67) is used to subtractively etch both the transistor material and thereafter the first capacitor electrode material to form a plurality of pillars (e.g., 25, 70) that individually comprise the transistor material and the first capacitor electrode material. Capacitors (e.g., 42, 42*a*) are formed that individually comprise the first capacitor electrode material of individual of the pillars. Vertical transistors (e.g., 64, 64*a*) are formed above the capacitors and that individually comprise the transistor material of the individual pillars. Any other attribute(s) or aspect(s) as shown and/or described herein with respect to other embodiments may be used.

In one embodiment, a method used in forming an array (e.g., 10) of memory cells (e.g., 68, 68*a*) comprises forming a vertical stack (e.g., 12) comprising transistor material (e.g., 14) directly above and directly against a first capacitor electrode material (e.g., 16). A mask (e.g., 28, 67) is used to subtractively etch both the transistor material and thereafter the first capacitor electrode material to form a plurality of pillars (e.g., 25, 70) that individually comprise the transistor material and the first capacitor electrode material. A capacitor insulator (e.g., 34) is formed aside the first capacitor electrode material of the pillars and a second capacitor electrode material (e.g., 36) is formed laterally-outward of the capacitor insulator. A plurality of gate lines (e.g., 62) is formed above the second capacitor electrode material. Individual of the gate lines extend along a row direction (e.g., 27) and are operatively laterally-proximate channel regions of the transistor material of individual of the pillars. The transistor material of the individual pillars and its laterally-proximate gate line comprising comprise a vertical transistor (e.g., 64). A plurality of digitlines (e.g., 66) is formed and that are individually above the gate lines and extend along a column direction (e.g., 24). Individual of the digitlines are electrically coupled to individual of the vertical transistors. Any other attribute(s) or aspect(s) as shown and/or described herein with respect to other embodiments may be used.

In one embodiment, a method used in forming an array (e.g., 10) of vertical transistors (e.g., 64, and regardless of whether capacitors and/or memory cells are formed) comprises forming a vertical stack (e.g., 12) comprising transistor material (e.g., 14). Time-spaced first and second masks (e.g., 20 and 28, respectively) are used to subtractively etch the transistor material to form a plurality of first pillars (e.g., 25*a*) individually comprising the transistor material. The second mask is formed after the first mask and comprises horizontally-elongated mask lines (e.g., 30). Masking material (e.g., 63) is formed aside the mask lines. The mask lines are removed and sidewall-spacer lines (e.g., 65) are formed in void space in the masking material formed from the removing of the mask lines. The masking material and sidewall-spacer lines are used to comprise a mask (e.g., 67) while etching the first pillars to bifurcate them into two second pillars (e.g., 71) that individually comprise a vertical transistor (e.g., 64*a*). Any other attribute(s) or aspect(s) as shown and/or described herein with respect to other embodiments may be used.

In one embodiment, a method used in forming an array e.g., 10) of capacitors (e.g., 42, and regardless of whether transistors and/or memory cells are formed) comprises using time-spaced first and second masks (e.g., 20 and 28, respectively) to subtractively etch first capacitor electrode material (e.g., 16) to form a plurality of first pillars (e.g., 25*a*) individually comprising the first capacitor electrode material. The second mask is formed after the first mask and comprises horizontally-elongated mask lines (e.g., 30). Masking material (e.g., 63) is formed aside the mask lines. The mask lines are removed and sidewall-spacer lines (e.g., 65) are formed in void space in the masking material formed from the removing of the mask lines. The masking material and sidewall-spacer lines comprise a mask (e.g., 67) that is used while etching the first pillars to bifurcate them into two second pillars (e.g., 71) that individually comprise a first capacitor electrode comprising the first capacitor electrode material. A capacitor insulator (e.g., 34) is aside the first capacitor electrode material and a second capacitor electrode material (e.g., 36) is laterally-outward of the capacitor insulator. Any other attribute(s) or aspect(s) as shown and/or described herein with respect to other embodiments may be used.

In one embodiment, a method used in forming an array (e.g., 10*b*) of memory cells (e.g., 68) comprises forming a plurality of first pillars (e.g., 25*b*) individually comprising first capacitor electrodes (e.g., 41). Sacrificial material (e.g., 29) is formed laterally about the first pillars. A plurality of vertical transistors (e.g., 64) is formed above the sacrificial material and above the first pillars. The vertical transistors individually comprise a second pillar (e.g., 71) directly above and directly electrically coupled to the first pillars. The second pillars individually comprise a channel region (e.g., material 15) and a top source/drain region (e.g., material 13) there-above. After forming the second pillars, the sacrificial material is removed from being laterally about the first pillars. After removing the sacrificial material, a capacitor insulator (e.g., 34) is formed aside the first capacitors of the first pillars and a second capacitor electrode (e.g., 40) is formed laterally-outward of the capacitor insulator. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, an array (e.g., 10) of memory cells (e.g., 68, 68*a*) comprises a plurality of capacitors (e.g., 42) in rows (e.g., 44) along a row direction (e.g., 27) and in columns (e.g., 99) along a column direction (e.g., 24). The capacitors individually comprise a first capacitor electrode (e.g., 41), a second capacitor electrode (e.g., 40) laterally-outward of the first capacitor electrode, and a capacitor insulator (e.g., 34) between the first and second capacitor electrodes. A plurality of vertical transistors (e.g., 64) is in the rows and columns above the plurality of capacitors. The vertical transistors individually comprise a top source/drain region (e.g., material 13), a bottom source/drain region (e.g., material 17), and a channel region (e.g., material 15) vertically there-between. Individual of the vertical transistors are directly electrically coupled to individual of the first capacitor electrodes. A plurality of gate lines (e.g., 64) are individually operatively laterally-proximate the channel regions along individual of the rows. A plurality of digitlines (e.g., 66) are included and that are individually above the gate lines and are electrically coupled to the top source/drain regions along individual of the columns. A plurality of conductive lines (e.g., 46, 46*a*) are included, that are individually longitudinally-elongated in and extend along the row direction aside and are directly against the capacitor insulator and that are below the gate lines. Individual of the conductive lines comprise the second capacitor electrode of individual of the capacitors. The individual conductive lines comprise a shared of the second capacitor electrodes of immediately-row-adjacent of the capacitors and interconnect the individual second capacitor electrodes longitudinally along immediately-adjacent of the rows. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semi conductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming an array of memory cells comprises forming a vertical stack comprising transistor material directly above and directly against a first capacitor electrode material. A mask is used to subtractively etch both the transistor material and thereafter the first capacitor electrode material to form a plurality of pillars that individually comprise the transistor material and the first capacitor electrode material. Capacitors are formed that individually comprise the first capacitor electrode material of individual of the pillars. Vertical transistors are formed above the capacitors that individually comprise the transistor material of the individual pillars.

In some embodiments, a method used in forming an array of memory cells comprises forming a vertical stack comprising transistor material directly above and directly against a first capacitor electrode material. A mask is used to subtractively etch both the transistor material and thereafter the first capacitor electrode material to form a plurality of pillars that individually comprise the transistor material and the first capacitor electrode material. A capacitor insulator is formed aside the first capacitor electrode material of the pillars and a second capacitor electrode material is formed laterally-outward of the capacitor insulator. A plurality of gate lines is formed above the second capacitor electrode material. Individual of the gate lines extend along a row direction and are operatively laterally-proximate channel regions of the transistor material of individual of the pillars. The transistor material of the individual pillars and its laterally-proximate gate line comprise a vertical transistor. A plurality of digitlines is formed that are individually above the gate lines and extend along a column direction. Individual of the digitlines are electrically coupled to individual of the vertical transistors.

In some embodiments, a method used in forming an array of vertical transistors comprises forming a vertical stack comprising transistor material. Time-spaced first and second masks are used to subtractively etch the transistor material to form a plurality of first pillars that individually comprise the transistor material. The second mask is formed after the first mask and comprises horizontally-elongated mask lines. Masking material is formed aside the mask lines. The mask lines are removed and sidewall-spacer lines are formed in the void space in the masking material formed from the removal of the mask lines. The masking material and sidewall-spacer lines are used to comprise a mask while etching the first pillars to bifurcate them into two second pillars that individually comprise a vertical transistor.

In some embodiments, a method used in forming an array of capacitors comprises using time-spaced first and second masks to subtractively etch first capacitor electrode material to form a plurality of first pillars that individually comprise the first capacitor electrode material. The second mask is formed after the first mask and comprises horizontally-elongated mask lines. Masking material is formed aside the mask lines. The mask lines are removed and form sidewall-spacer lines in the void space in the masking material formed from the removal of the mask lines. The masking material and sidewall-spacer lines are used to comprise a mask while etching the first pillars to bifurcate them into two second pillars that individually comprise a first capacitor electrode comprising the first capacitor electrode material. A capacitor insulator is formed aside the first capacitor electrode material and a second capacitor electrode material is formed laterally-outward of the capacitor insulator.

In some embodiments, a method used in forming an array of memory cells comprises forming a vertical stack comprising transistor material directly above and directly against a first capacitor electrode material. Time-spaced first and second masks are used to subtractively etch both the transistor material and thereafter the first capacitor electrode material to form a plurality of pillars that individually comprise the transistor material and the first capacitor electrode material. The second mask is formed after the first mask and comprises mask lines that extend along a row direction. The subtractive etch using the second mask comprising the mask lines forms a plurality of trenches that are individually longitudinally-elongated in and extend along the row direction aside the first capacitor electrode material of the pillars. A capacitor insulator is formed in the trenches aside the first capacitor electrode material of the pillars and a second capacitor electrode material is formed in the trenches laterally-outward of the capacitor insulator to form conductive lines that are individually in individual of the trenches. Individual of the conductive lines comprise a second capacitor electrode of individual capacitors. The individual conductive lines comprise a shared of the second capacitor electrodes of immediately-row-adjacent of the capacitors and interconnect the individual second capacitor electrodes longitudinally along immediately-adjacent rows of the capacitors. A plurality of gate lines is formed above the conductive lines. Individual of the gate lines are operatively laterally-proximate channel regions of the transistor material of the pillars and extend along the row direction. The transistor material of the individual pillars and its laterally-proximate gate line comprise a vertical transistor. A plurality of digitlines is formed that are individually above the gate lines and extend along a column direction. The digitlines individually are electrically coupled to individual of the vertical transistors.

In some embodiments, a method used in forming art array of memory cells comprises forming a plurality of first pillars individually comprising first capacitor electrodes. Sacrificial material is formed laterally about the first pillars. A plurality of vertical transistors is formed above the sacrificial material and above the first pillars. The vertical transistors individually comprise a second pillar directly above and directly electrically coupled to the first pillars. The second pillars individually comprise a channel region and a top source/drain region there-above. After forming the second pillars, the sacrificial material is removed from being laterally about the first pillars. After removing the sacrificial material, a capacitor insulator is formed aside the first capacitors of the first pillars and a second capacitor electrode is laterally-outward of the capacitor insulator.

In some embodiments, an array of memory cells comprises a plurality of capacitors in rows along a row direction and in columns along a column direction. The capacitors individually comprise a first capacitor electrode. A second capacitor electrode is laterally-outward of the first capacitor electrode. A capacitor insulator is between the first and second capacitor electrodes. A plurality of vertical transistors is in the rows and columns above the plurality of capacitors. The vertical transistors individually comprise a top source/drain region, a bottom source/drain region, and a channel region vertically there-between. Individual of the vertical transistors are directly electrically coupled to individual of the first capacitor electrodes. A plurality of gate lines individually is operatively laterally-proximate the channel regions along individual of the rows. A plurality of digitlines individually are above the gate lines and electrically coupled to the top source/drain regions along individual of the columns. A plurality of conductive lines individually are longitudinally-elongated in and extend along the row direction aside and are directly against the capacitor insulator and that are below the gate lines. Individual of the conductive lines comprise the second capacitor electrode of individual of the capacitors. The individual conductive lines comprise a shared of the second capacitor electrodes of immediately-row-adjacent of the capacitors and interconnect the individual second capacitor electrodes longitudinally along immediately-adjacent of the rows.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of memory cells, comprising:

forming a vertical stack comprising transistor material directly above and directly against a first capacitor electrode material;

using a mask to subtractively etch both the transistor material and thereafter the first capacitor electrode material to form a plurality of pillars that individually comprise the transistor material and the first capacitor electrode material;

forming capacitors individually comprising the first capacitor electrode material of individual of the pillars;

forming vertical transistors above the capacitors and that individually comprise the transistor material of the individual pillars;

wherein the mask is a second mask and the etch is a second etch, and further comprising prior to using the second mask and prior to the second etch:

using a first mask to subtractively etch both the transistor material and thereafter the first capacitor electrode material to form a plurality of walls that individually comprise the transistor material and the first capacitor electrode material; and after said using the first mask, using the second mask to second etch the wall to form the plurality of pillars therefrom.

2. The method of claim 1 wherein forming the vertical transistors comprises forming a plurality of gate lines above the capacitors, individual of the gate lines extending along a row direction and being operatively laterally-proximate channel regions of the transistor material of individual of the pillars, the walls being formed before forming the gate lines and being horizontally-elongated a column direction.

3. A method used in forming an array of memory cells, comprising:

forming a vertical stack comprising transistor material directly above and directly against a first capacitor electrode material;

using a mask to subtractively etch both the transistor material and thereafter the first capacitor electrode material to form a plurality of pillars that individually comprise the transistor material and the first capacitor electrode material;

forming capacitors individually comprising the first capacitor electrode material of individual of the pillars;

forming vertical transistors above the capacitors and that individually comprise the transistor material of the individual pillars;

wherein, the mask comprises sacrificial horizontal mask lines;

the vertical transistors are formed to comprise gate lines that are above the capacitors; and removing the sacrificial horizontal mask lines after forming gate lines.

4. A method used in forming an array of memory cells, comprising:

forming a vertical stack comprising transistor material directly above and directly against a first capacitor electrode material;

using a mask to subtractively etch both the transistor material and thereafter the first capacitor electrode material to form a plurality of pillars that individually comprise the transistor material and the first capacitor electrode material;

forming capacitors individually comprising the first capacitor electrode material of individual of the pillars;

forming vertical transistors above the capacitors and that individually comprise the transistor material of the individual pillars;

wherein the pillars are first pillars and further comprising bifurcating individual of the first pillars into two second pillars.

5. The method of claim 4 comprising forming the capacitors to comprise a capacitor insulator laterally-outward of the first capacitor electrode material and a second capacitor electrode material laterally-outward of the capacitor insulator, the bifurcating occurring after forming the capacitor insulator and the second capacitor electrode material.

6. The method of claim 4 wherein the vertical transistors are formed to comprise gate lines that are above the capacitors, the bifurcating occurring after forming the gate lines.

7. The method of claim 6 comprising forming the capacitors to comprise a capacitor insulator laterally-outward of the first capacitor electrode material and a second capacitor electrode material laterally-outward of the capacitor insulator, the bifurcating occurring after forming the capacitor insulator and the second capacitor electrode material.

8. A method used in forming an array of memory cells, comprising:

forming a vertical stack comprising transistor material directly above and directly against a first capacitor electrode material;

using a mask to subtractively etch both the transistor material and thereafter the first capacitor electrode material to form a plurality of pillars that individually comprise the transistor material and the first capacitor electrode material;

forming capacitors individually comprising the first capacitor electrode material of individual of the pillars;

forming vertical transistors above the capacitors and that individually comprise the transistor material of the individual pillars;

forming the capacitors to comprise a capacitor insulator laterally-outward of the first capacitor electrode material and a second capacitor electrode laterally-outward of the capacitor insulator; and forming a plurality of conductive lines that are individually longitudinally-elongated horizontally and extend alongside and are directly against the capacitor insulator, individual of the conductive lines comprising the second capacitor electrode of individual of the capacitors, the individual conductive lines comprising a shared of the second capacitor electrodes of immediately-laterally-adjacent of the capacitors and interconnecting the individual second capacitor electrodes longitudinally along the individual conductive lines.

9. A method used in forming an array of memory cells, comprising:

forming a vertical stack comprising transistor material directly above and directly against a first capacitor electrode material;

using a mask to subtractively etch both the transistor material and thereafter the first capacitor electrode material to form a plurality of pillars that individually comprise the transistor material and the first capacitor electrode material;

forming a capacitor insulator aside the first capacitor electrode material of the pillars and a second capacitor electrode material laterally-outward of the capacitor insulator;

forming a plurality of gate lines above the second capacitor electrode material, individual of the gate lines extending along a row direction and being operatively laterally-proximate channel regions of the transistor material of individual of the pillars, the transistor material of the individual pillars and its laterally-proximate gate line comprising a vertical transistor; and forming a plurality of digitlines that are individually above the gate lines and extend along a column direction, individual of the digitlines being electrically coupled to individual of the vertical transistors.

10. The method of claim 9 wherein the gate lines are formed directly above the second capacitor electrode material.

11. The method of claim 9 wherein the mask is a second mask and the etch is a second etch, and further comprising prior to using the second mask and prior to the second etch:
using a first mask to subtractively etch both the transistor material and thereafter the first capacitor electrode material to form a plurality of walls that individually comprise the transistor material and the first capacitor electrode material; and
after said using the first mask, using the second mask to second etch the wall to form the plurality of pillars therefrom.

12. A method used in forming an array of vertical transistors, comprising:
forming a vertical stack comprising transistor material;
using time-spaced first and second masks to subtractively etch the transistor material to form a plurality of first pillars individually comprising the transistor material, the second mask being formed after the first mask and comprising horizontally-elongated mask lines;
forming masking material aside the mask lines;
removing the mask lines and forming sidewall-spacer lines in void space in the masking material formed from the removing of the mask lines; and
using the masking material and sidewall-spacer lines to comprise a mask while etching the first pillars to bifurcate them into two second pillars that individually comprise a vertical transistor.

13. The method of claim 12 wherein the vertical transistors are formed to comprise gate lines, the bifurcating occurring after forming the gate lines.

14. The method of claim 12 wherein the vertical transistors are formed to comprise gate lines laterally adjacent channel regions of the transistor material of individual of the second pillars, individual of the gate lines being operatively laterally-adjacent only one side of the channel region of individual of the vertical transistors.

15. A method used in forming an array of capacitors, comprising:
using time-spaced first and second masks to subtractively etch first capacitor electrode material to form a plurality of first pillars individually comprising the first capacitor electrode material, the second mask being formed after the first mask and comprising horizontally-elongated mask lines;
forming masking material aside the mask lines;
removing the mask lines and forming sidewall-spacer lines in void space in the masking material formed from the removing of the mask lines;
using the masking material and sidewall-spacer lines to comprise a mask while etching the first pillars to bifurcate them into two second pillars that individually comprise a first capacitor electrode comprising the first capacitor electrode material; and
forming a capacitor insulator aside the first capacitor electrode material and a second capacitor electrode material laterally-outward of the capacitor insulator.

16. The method of claim 15 wherein the bifurcating occurs after forming the capacitor insulator and the second capacitor electrode material.

17. A method used in forming an array of memory cells, comprising:
forming a vertical stack comprising transistor material directly above and directly against a first capacitor electrode material;
using time-spaced first and second masks to subtractively etch both the transistor material and thereafter the first capacitor electrode material to form a plurality of pillars individually comprising the transistor material and the first capacitor electrode material, the second mask being formed after the first mask and comprising mask lines extending along a row direction, the subtractive etch using the second mask comprising the mask lines forming a plurality of trenches that are individually longitudinally-elongated in and extend along the row direction aside the first capacitor electrode material of the pillars;
forming a capacitor insulator in the trenches aside the first capacitor electrode material of the pillars and a second capacitor electrode material in the trenches laterally-outward of the capacitor insulator to form conductive lines that are individually in individual of the trenches, individual of the conductive lines comprising a second capacitor electrode of individual capacitors, the individual conductive lines comprising a shared of the second capacitor electrodes of immediately-row-adjacent of the capacitors and interconnecting the individual second capacitor electrodes longitudinally along immediately-adjacent rows of the capacitors;
forming a plurality of gate lines above the conductive lines, individual of the gate lines being operatively laterally-proximate channel regions of the transistor material of the pillars and extending along the row direction, the transistor material of the individual pillars and its laterally-proximate gate line comprising a vertical transistor; and
forming a plurality of digitlines that are individually above the gate lines and extend along a column direction, the digitlines individually being electrically coupled to individual of the vertical transistors.

18. A method used in forming an array of memory cells, comprising:
forming a plurality of first pillars individually comprising first capacitor electrodes;
forming sacrificial material laterally about the first pillars;
forming a plurality of vertical transistors above the sacrificial material and above the first pillars, the vertical transistors individually comprising a second pillar directly above and directly electrically coupled to the first pillars, the second pillars individually comprising a channel region and a top source/drain region thereabove;
after forming the second pillars, removing the sacrificial material from being laterally about the first pillars; and
after removing the sacrificial material, forming a capacitor insulator aside the first capacitors of the first pillars and a second capacitor electrode laterally-outward of the capacitor insulator.

19. The method of claim 17 wherein tops of the conductive lines are below tops of the first capacitor electrode material.

20. The method of claim 17 wherein bottoms of the conductive lines are above bottoms of the first capacitor electrode material.

21. The method of claim 17 wherein the conductive lines are directly electrically coupled together.

22. The method of claim 17 wherein the conductive lines individually are directly under individual of the gate lines.

23. The method of claim 17 wherein the conductive lines have a trough like shape.

24. The method of claim 23 comprising solid insulator material filling the trough of the trough-like shape.

25. The method of claim 18 wherein the second pillars individually comprise a bottom source/drain region directly below the channel region and directly against one of the first pillars.

26. The method of claim 18 wherein the vertical transistors are formed to comprise gate lines, the removing of the sacrificial material occurring after forming the gate lines.

* * * * *